US012051645B2

(12) United States Patent
Li et al.

(10) Patent No.: US 12,051,645 B2
(45) Date of Patent: Jul. 30, 2024

(54) TWO 2D CAPPING LAYERS ON INTERCONNECT CONDUCTIVE STRUCTURE TO INCREASE INTERCONNECT STRUCTURE RELIABILITY

(71) Applicant: Taiwan Semiconductor Manufacturing Company, Ltd., Hsinchu (TW)

(72) Inventors: Shu-Wei Li, Hsinchu (TW); Yu-Chen Chan, Taichung (TW); Shin-Yi Yang, New Taipei (TW); Ming-Han Lee, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 59 days.

(21) Appl. No.: 17/869,898

(22) Filed: Jul. 21, 2022

(65) Prior Publication Data

US 2022/0359381 A1 Nov. 10, 2022

Related U.S. Application Data

(62) Division of application No. 17/097,406, filed on Nov. 13, 2020, now Pat. No. 11,532,549.

(51) Int. Cl.
*H01L 23/522* (2006.01)
*H01L 21/768* (2006.01)
*H01L 23/528* (2006.01)

(52) U.S. Cl.
CPC .... *H01L 23/5226* (2013.01); *H01L 21/76816* (2013.01); *H01L 21/76831* (2013.01); *H01L 21/76846* (2013.01); *H01L 23/5283* (2013.01)

(58) Field of Classification Search
CPC .......... H01L 23/53238; H01L 23/5226; H01L 23/53295; H01L 23/5329; H01L 21/76849; H01L 21/76843
See application file for complete search history.

(56) References Cited

U.S. PATENT DOCUMENTS 8,102,054 B2 * 1/2012 Zhang ............... H01L 23/53238
257/734
2004/0135261 A1 * 7/2004 Lee .................... H01L 21/76834
257/E21.585

(Continued)

OTHER PUBLICATIONS

Notice of Allowance dated Sep. 15, 2022 for U.S. Appl. No. 17/097,406.

(Continued)

*Primary Examiner* — Jaehwan Oh
*Assistant Examiner* — John M Parker
(74) *Attorney, Agent, or Firm* — Eschweiler & Potashnik, LLC

(57) ABSTRACT

In some embodiments, the present disclosure relates to an integrated chip that includes a first interconnect dielectric layer arranged over a substrate. A first interconnect conductive structure extends through the first interconnect dielectric layer. A first capping layer is arranged over the first interconnect conductive structure, and a second capping layer is arranged over the first capping layer. The first capping layer includes a first two-dimensional material that is different than a second two-dimensional material of the second capping layer. An etch stop layer is arranged over the first interconnect dielectric layer and the second capping layer. The integrated chip further includes a second interconnect dielectric layer arranged over the etch stop layer and a second interconnect conductive structure extending through the second interconnect dielectric layer and the etch stop layer to contact the first interconnect conductive structure.

20 Claims, 15 Drawing Sheets

(56) References Cited

U.S. PATENT DOCUMENTS

| | | |
|---|---|---|
| 2006/0202346 A1 | 9/2006 | Shih et al. |
| 2014/0264872 A1 | 9/2014 | Lin et al. |
| 2017/0186682 A1* | 6/2017 | Anderson ......... H01L 21/31053 |
| 2018/0040686 A1 | 2/2018 | Yang |
| 2018/0053685 A1 | 2/2018 | Ahn et al. |
| 2021/0005548 A1* | 1/2021 | Lee ................... H01L 21/76832 |
| 2021/0091300 A1 | 3/2021 | Doris et al. |
| 2023/0178474 A1* | 6/2023 | Bhosale .............. H01L 23/5226 |
| | | 257/774 |

OTHER PUBLICATIONS

Wikipedia.org "Copper Interconnects." Published on Sep. 8, 2020.
Wikipedia.org "Diffusion Barrier." Published on Jan. 11, 2019.
Wikipedia.org "Graphite Intercalation Compound." Published on Jun. 15, 2020.
Science Direct. "Exfoliation—An Overview." Nanocoatings and Ultra-Thin Films, published in 2011.
LaPedus, Mark. "Where Is Selective Deposition?" Semiconductor Engineering, published on Jun. 25, 2018.
Non-Final Office Action dated Mar. 18, 2022 for U.S. Appl. No. 17/097,406.

* cited by examiner

TWO 2D CAPPING LAYERS ON INTERCONNECT CONDUCTIVE STRUCTURE TO INCREASE INTERCONNECT STRUCTURE RELIABILITY

REFERENCE TO RELATED APPLICATION

This Application is a Divisional of U.S. application Ser. No. 17/097,406, filed on Nov. 13, 2020, the contents of which are hereby incorporated by reference in their entirety.

BACKGROUND

As dimensions and feature sizes of semiconductor integrated circuits (ICs) are scaled down, the density of the elements forming the ICs is increased and the spacing between elements is reduced. As the distance between any two adjacent conductive features decreases, the resulting capacitance increases, which will increase power consumption and time delay. Thus, manufacturing techniques and device design are being investigated to reduce IC size while maintaining or improving performance of the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
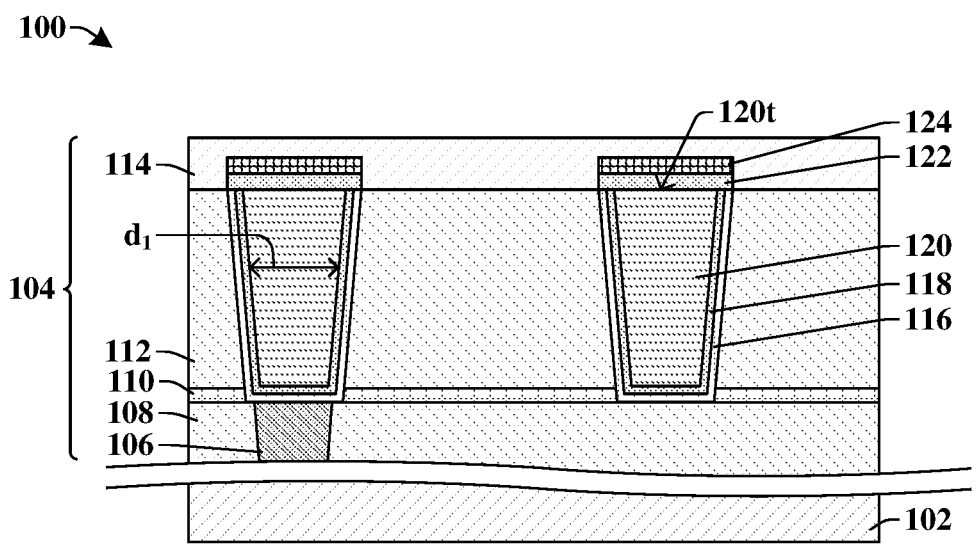
FIG. 1 illustrates a cross-sectional view of some embodiments of an integrated chip having a first capping layer and a second capping layer arranged over a topmost surface of a first interconnect conductive structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips may include a number of semiconductor devices (e.g., transistors, capacitors, inductors, etc.) and/or memory devices disposed over and/or within a semiconductor substrate. An interconnect structure may be disposed over the semiconductor substrate and coupled to the semiconductor devices. The interconnect structure may include interconnect conductive structures such as interconnect wires and interconnect vias within interconnect dielectric layers. The interconnect conductive structures provide electrical pathways between different semiconductor devices disposed within and/or over the semiconductor substrate.

Some embodiments of an interconnect structure include a first interconnect conductive structure arranged within an interconnect dielectric layer. In some embodiments, as the width of the first interconnect conductive structure decreases, the resistivity of the first interconnect conductive structure increases, which reduces the reliability of the interconnect structure. Further, in some instances, as the width of the first interconnect conductive structure decreases, electromigration increases, which reduces the reliability of the interconnect structure.

A first capping layer comprising, for example, graphene or some other first two-dimensional material, may be formed on a topmost surface of the first interconnect conductive structure to reduce resistivity and electromigration of the first interconnect conductive structure. In some embodiments, the first two-dimensional material of the first capping layer may be a material that has a planar, hexagonal structure, such as, for example, graphene, hexagonal boron nitride, molybdenum sulfide, tantalum sulfide, hafnium sulfide, tungsten selenide, borocarbonates, germanane, $Ni_3(HITP)_2$, or some other suitable material with a two-dimensional crystal structure. However, in some embodiments, the first capping layer comprises a material that other layers to be deposited on the first capping layer, such as etch stop layers, interconnect dielectric layers, barrier layers, liner layers, or the like do not adhere well to. Thus, the structural integrity of the interconnect structure may be compromised when using certain materials as the first capping layer over the first interconnect conductive structure.

Various embodiments of the present disclosure relate to an interconnect structure comprising a first capping layer over a first interconnect conductive structure and a second capping layer arranged over the first capping layer. In such embodiments, the first and second capping layers comprise different two-dimensional materials. The first capping layer is arranged directly on a topmost surface of the first interconnect conductive structure, and the second capping layer is arranged directly on the first capping layer. The first capping layer comprises a first two-dimensional material that reduces the electromigration and the resistivity of the first interconnect conductive structure. The second capping layer comprises a second two-dimensional material that has a better adhesion with other layers (e.g., etch stop layers, interconnect dielectric layers, barrier layers, liner layer, etc.) to be deposited over the first interconnect conductive structure than the first two-dimensional material of the first capping layer. Thus, the second capping layer mitigates any adhesion issues that the first capping layer may have such that the first capping layer may still be used to reduce resistivity and electromigration of the first interconnect conductive structure to increase the reliability of the interconnect structure without compromising the structural integrity of the interconnect structure.

FIG. 1 illustrates a cross-sectional view 100 of some embodiments of an integrated chip comprising an interconnect structure having a first and second capping layer over a first conductive structure.

The integrated chip of FIG. 1 includes an interconnect structure 104 arranged over a substrate 102. In some embodiments, the interconnect structure 104 comprises a lower interconnect via 106 and a first interconnect conductive structure 120 arranged over and coupled to the lower interconnect via 106. In some embodiments, the interconnect structure 104 further comprises a lower interconnect dielectric layer 108, wherein the lower interconnect via 106 is embedded in and extends through the lower interconnect dielectric layer 108, and comprises a first interconnect dielectric layer 112, wherein the first interconnect conductive structure 120 is embedded in and extends through the first interconnect dielectric layer 112. In some embodiments, a first etch stop layer 110 may be arranged between the lower and first interconnect dielectric layers 108, 112. In some such embodiments, the first interconnect conductive structure 120 may extend through the first etch stop layer 110 to electrically contact the lower interconnect via 106.

Further, in some embodiments, the interconnect structure 104 may be coupled to one or more semiconductor devices (e.g., transistors, inductors, capacitors, etc.) and/or memory devices (not shown) disposed over and/or within the substrate 102. Thus, the conductive features (e.g., lower interconnect via 106, first interconnect conductive structure 120) of the interconnect structure 104 may be electrically coupled to one another and to any underlying or overlying devices (not shown) to provide a conductive pathway for signals (e.g., voltage, current) traveling through the integrated chip.

In some embodiments, more than one of the first interconnect conductive structures 120 are embedded within the first interconnect dielectric layer 112. In some embodiments, the first interconnect structure 120 has outermost sidewalls that contact a first barrier layer 116 and are surrounded by a first liner layer 118 that contacts the first barrier layer 116. In some embodiments, the first barrier layer 116 may comprise a material that mitigates diffusion of the first interconnect conductive structure 120 into the first interconnect dielectric layer 112, thereby reducing cross-talk in the interconnect structure 104. Further, in some embodiments, the first liner layer 118 may be a seed layer to aid in the formation of the first interconnect conductive structure 120 on the first liner layer 118. In some other embodiments, the first liner layer 118 may be a glue layer, wherein the first interconnect conductive structure 120 adheres to the first liner layer 118 better than the first barrier layer 116. Further, in some embodiments, the first liner layer 118 and/or the first barrier layer 116 cover a bottommost surface of the first interconnect conductive structure 120.

In some embodiments, as a critical dimension of the first interconnect conductive structure 120 decreases, the resistivity of the first interconnect conductive structure 120 increases, thereby reducing the reliability of the interconnect structure 104. In some embodiments, the critical dimension is defined as a minimum dimension of the first interconnect conductive structure 120, such as, for example, a first distance $d_1$ in FIG. 1. In some embodiments, the first distance $d_1$ does not include the first liner layer 118 and/or the first barrier layer 116, whereas in other embodiments, the first distance $d_1$ includes the first liner layer 118 and/or the first barrier layer 116. In some embodiments, the first distance $d_1$ is in a range of between, for example, approximately 5 angstroms and approximately 500 angstroms.

In some embodiments, a first capping layer 122 is arranged over a topmost surface 120t of the first interconnect conductive structure 120. In some embodiments, the first capping layer 122 comprises a first two-dimensional material that reduces the resistivity of the first interconnect conductive structure 120. In some embodiments, the first two-dimensional material of the first capping layer 122 may comprise, for example, a material having a two-dimensional structure (e.g., hexagonal crystal structure, planar crystal structure) such as, for example, graphene, intercalated graphene, nitrogen-doped graphene, oxygen-graphene, modified graphene, or some other type of graphene. In some other embodiments, the first capping layer 122 may comprise, for example, hexagonal boron nitride, molybdenum sulfide, tantalum sulfide, hafnium sulfide, tungsten selenide, borocarbonates, germanane, $Ni_3(HITP)_2$, or some other suitable material with a two-dimensional crystal structure. In some embodiments, the first capping layer 122 may also reduce electromigration of the first interconnect conductive structure 120. By improving the electromigration of the first interconnect conductive structure 120, the first capping layer 122 allows the first interconnect conductive structure 120 to withstand high currents without changing shape and/or breaking down.

In some embodiments, the first two-dimensional material of the first capping layer 122 may not have a dangling bond and does not adhere well to layers that are arranged over the first capping layer 122, such as, for example, a second etch stop layer 114. Thus, in some embodiments, a second capping layer 124 is arranged over the first capping layer 122. In some embodiments, the second capping layer 124 comprises a second two-dimensional material that is different than the first two-dimensional material, wherein overlying layers/features, such as the second etch stop layer 114, adhere to the second two-dimensional material of the second capping layer 124 better than the first two-dimensional material of the first capping layer 122. In other words, in some embodiments, the second capping layer 124 acts as a glue layer between the first capping layer 122 and any overlying layers/features, such as, for example, the second etch stop layer 114. In some embodiments, the second two-dimensional material of the second capping layer 124 may comprise, for example, hexagonal boron nitride, molybdenum sulfide, tantalum sulfide, hafnium sulfide, tungsten selenide, borocarbonates, germanane, $Ni_3(HITP)_2$, or some other suitable material with a two-dimensional crystal structure.

In some embodiments, the first capping layer 122 is selectively deposited onto the first interconnect conductive structure 120 and is not formed on the first interconnect dielectric layer 112. In some embodiments, the first capping layer 122 is also selectively deposited onto the first liner layer 118 and/or the first barrier layer 116. In some embodiments, the selective deposition is based on the first two-dimensional material of the first capping layer 122 being different than the first interconnect dielectric layer 112. Further, in some embodiments, the selective deposition is based on a pre-treatment technique to activate or deactivate certain layers such that the first capping layer 122 is selectively formed on the first interconnect conductive structure 120. It will be appreciated that other techniques of selective deposition are also within the scope of this disclosure. The selective deposition of the first capping layer 122 may increase the reliability of the interconnect structure 104 by avoiding deposition and subsequent removal of the first capping layer 122 on the first interconnect dielectric layer 112, thereby mitigating damage to the first interconnect dielectric layer 112 through removal processes (e.g., etching).

Further, in some embodiments, the second capping layer 124 is also selectively deposited on the first capping layer 122. Thus, in some embodiments, the second capping layer 124 directly contacts the first capping layer 122 and does not directly contact the first interconnect dielectric layer 112. In some embodiments, the second etch stop layer 114 is arranged over the second capping layer 124 and the first interconnect dielectric layer 112 to protect the first interconnect dielectric layer 112 and/or the second capping layer 124 from future deposition processes (e.g., physical vapor deposition (PVD), chemical vapor deposition (CVD), atomic layer deposition (ALD), sputtering, etc.), patterning processes (e.g., photolithography), and/or removal processes (e.g., chemical mechanical planarization (CMP)). Because the second capping layer 124 is arranged over the first capping layer 122, potential adhesion issues between the first capping layer 122 and the second etch stop layer 114 may be mitigated. Thus, the first and second capping layers 122, 124 reduce resistivity and electromigration of the first interconnect conductive structure 120 without compromising the structural integrity of the interconnect structure 104.

Figure 2A:
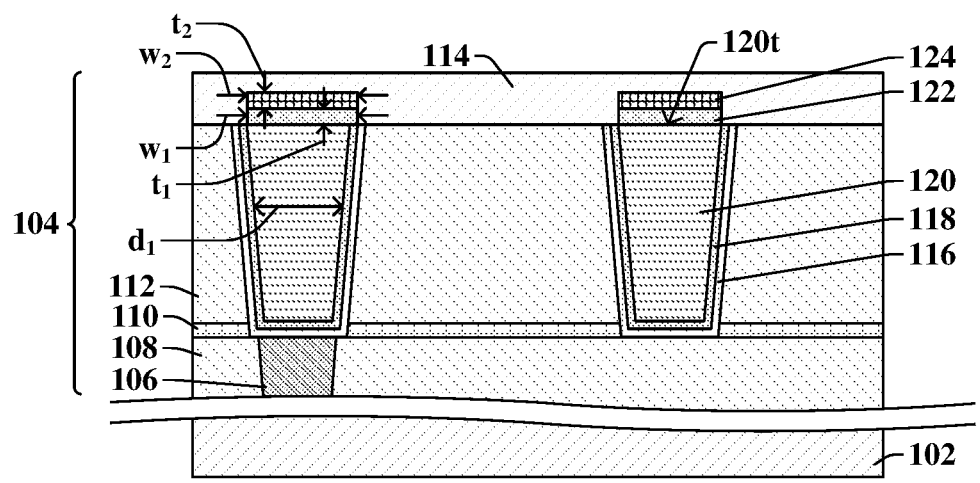
FIGS. 2A, 2B, 3, 4, and 5 illustrate cross-sectional views of some other embodiments of an integrated chip having a first capping layer arranged directly on a topmost surface of a first interconnect conductive structure and a second capping layer arranged directly on the first capping layer.

FIG. 2A illustrates a cross-sectional view 200A of some other embodiments of an integrated chip comprising an interconnect structure having a first and second capping layer over a first conductive structure.

In some embodiments, the first barrier layer 116 may comprise, for example, tantalum, tantalum nitride, titanium, titanium nitride, tungsten nitride, or the like. In some embodiments, the first liner layer 118 may comprise, for example, copper, cobalt, ruthenium, or some other suitable material. In some other embodiments, the first liner layer 118 may comprise tantalum, titanium, silicon nitride, or some other suitable material. In some embodiments, the first capping layer 122 is selectively deposited on the topmost surface 120t of the first interconnect conductive structure 120 and is not deposited on the first liner layer 118 and/or the first barrier layer 116.

In some embodiments, the first capping layer 122 may have a first width $w_1$ in a range of between, for example, approximately 5 angstroms and approximately 500 angstroms. In some embodiments, the first capping layer 122 has a first thickness $t_1$ in a range of between, for example, approximately 3 angstroms and approximately 300 angstroms. In some embodiments, the second capping layer 124 is selectively deposited on the first capping layer 122. In such embodiments, the first width $w_1$ of the first capping layer 122 may be about equal to a second width $w_2$ of the second capping layer 124. In some embodiments, the second width $w_2$ is in a range of between, for example, approximately 5 angstroms and approximately 500 angstroms. Further, in some embodiments, the second capping layer 124 may have a second thickness $t_2$ in a range of between, for example, approximately 3 angstroms and approximately 300 angstroms. In some embodiments, because the first and second capping layers 122, 124 comprise two-dimensional materials, the first and second thicknesses $t_1$, $t_2$ of the first and second capping layers 122, 124 may be substantially small (e.g., about 3 angstroms), which advantageously reduces the height of the overall interconnect structure 104.

Figure 2B:
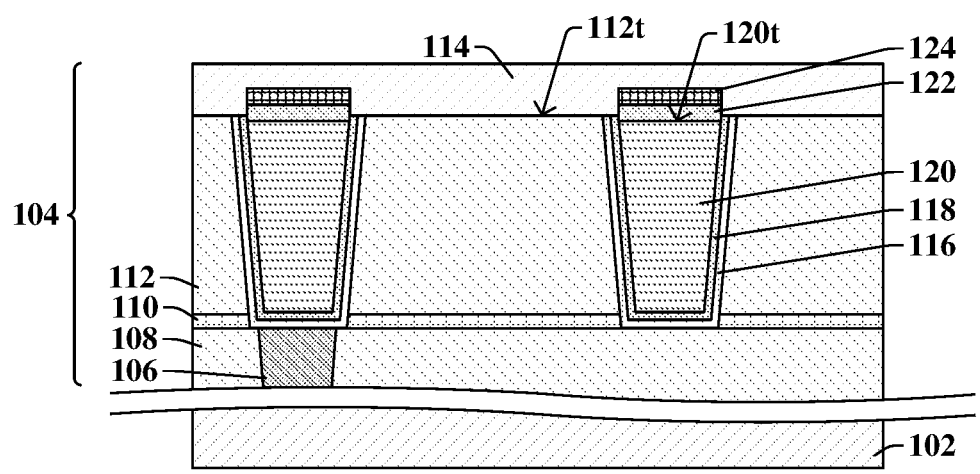

FIG. 2B illustrates a cross-sectional view 200B of some alternative embodiments of the cross-sectional view 200A of FIG. 2A.

In some embodiments, the topmost surface 120t of the first interconnect conductive structure 120 is arranged below a topmost surface 112t of the first interconnect dielectric layer 112. In some such embodiments, the topmost surface 120t of the first interconnect conductive structure 120 may be arranged below the topmost surface 112t of the first interconnect dielectric layer 112 because during formation of the first interconnect conductive structure 120, portions of the first interconnect conductive structure 120 may be etched back below the topmost surface 112t of the first interconnect dielectric layer 112. In some other embodiments, the topmost surface 120t of the first interconnect conductive structure 120 may be arranged below the topmost surface 112t of the first interconnect dielectric layer 112 because the first capping layer 122 reacts with first interconnect conductive structure 120 during the selective deposition of the first capping layer 122 on the first interconnect conductive structure 120. In some such embodiments, the first capping layer 122 may be arranged partially or completely below the topmost surface 112t of the first interconnect dielectric layer 112.

Figure 3:
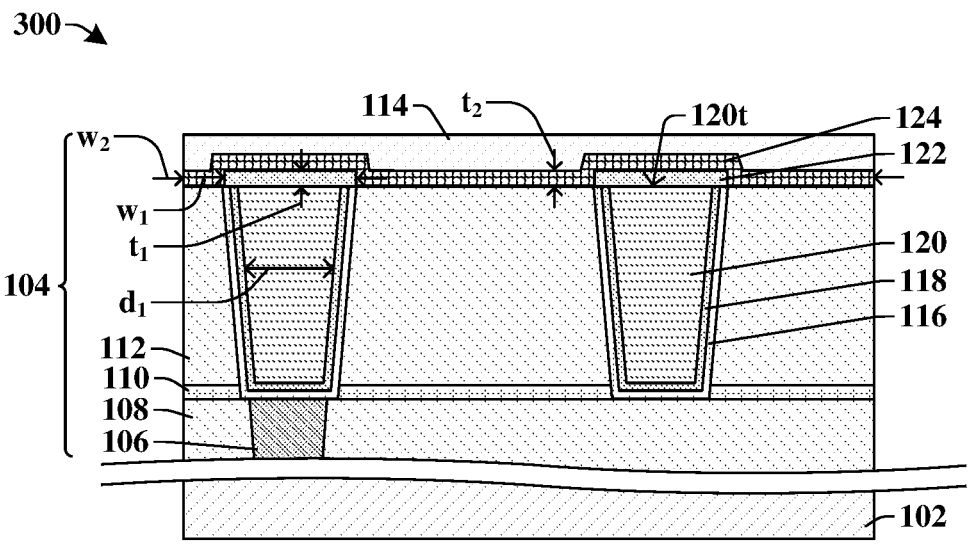

FIG. 3 illustrates a cross-sectional view 300 of some embodiments of an integrated chip comprising an interconnect structure having a first and second capping layer over a first conductive structure, wherein the second capping layer is wider than the first capping layer.

In some embodiments, while the first capping layer 122 is selectively deposited over the topmost surface 120t of the first interconnect conductive structure 120, the second capping layer 124 is not selectively deposited. Instead, in some such embodiments, the second capping layer 124 is formed over the first capping layer 122 and the first interconnect dielectric layer 112. In some embodiments, where there are more than one first interconnect conductive structures 120 within the first interconnect dielectric layer 112, the second capping layer 124 may continuously extend over and between the more than one first interconnect conductive structures 120. In such embodiments, the second capping layer 124 may be arranged laterally between one or more first capping layers 122. In such embodiments, the second capping layer 124 is arranged on and surrounds outer sidewalls of the first capping layer 122.

In some such embodiments, the second width $w_2$ of the second capping layer 124 is larger than the first width $w_1$ of the first capping layer 122. Further, in some embodiments, the second two-dimensional material of the second capping layer 124 is non-conductive, such that a first one of the first interconnect conductive structures 120 is not electrically coupled to a second one of the first interconnect conductive structures 120. In some embodiments, the first two-dimensional material of the first capping layer 122 may comprise a conductive or a non-conductive material. In some embodiments, the second capping layer 124 separates the second etch stop layer 114 from the first interconnect dielectric layer 112.

Figure 4:
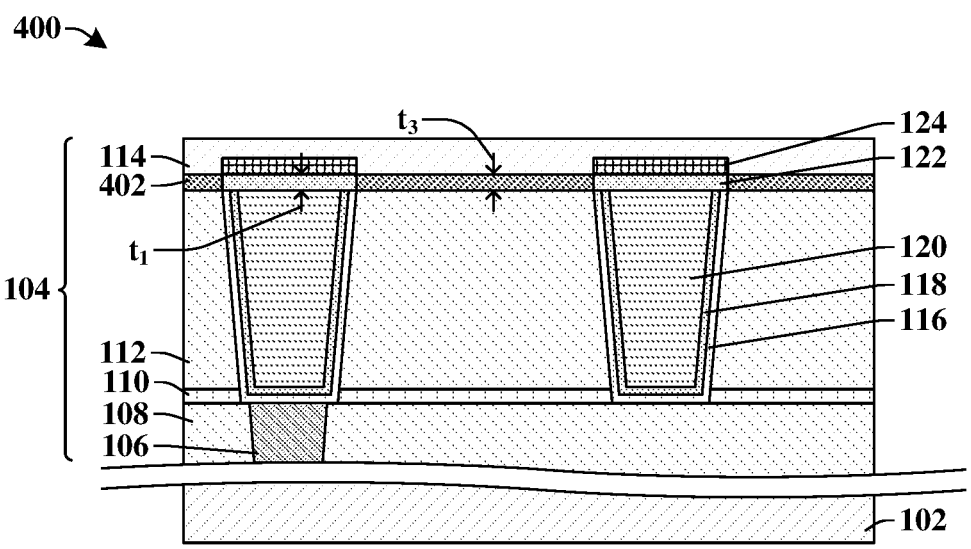

FIG. 4 illustrates a cross-sectional view 400 of some embodiments of an integrated chip comprising an interconnect structure having a first and second capping layer over a first conductive structure, wherein a protective layer laterally surrounds the first capping layer.

In some embodiments, the interconnect structure 104 further comprises a protective layer 402 that laterally surrounds the first capping layer 122 and that is arranged directly between the second etch stop layer 114 and the first interconnect dielectric layer 112. In some embodiments, the protective layer 402 comprises, for example, a nitride (e.g., silicon nitride), an oxide (e.g., silicon dioxide, silicon oxynitride), or some other suitable dielectric material that has a dielectric constant in a range of between, for example, approximately 1.5 and approximately 3.9. In some embodiments, the protective layer 402 has a third thickness $t_3$ in a range of between, for example, approximately 1 angstrom and approximately 500 angstroms. Thus, in some embodiments, the third thickness $t_3$ of the protective layer 402 may be less than, equal to, or greater than the first thickness $t_1$ of the first capping layer 122. In some embodiments, the protective layer 402 is selectively deposited onto the first interconnect dielectric layer 112 to protect the first interconnect dielectric layer 112 from damage from future processing steps, such as the selective deposition of the second capping layer 124. In some embodiments, the protective layer 402 is also selectively deposited over the first barrier layer 116 and/or the first liner layer 118.

In some embodiments, the first interconnect dielectric layer 112 and the lower interconnect dielectric layer 108 may each comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or some other low-k dielectric material having a dielectric constant in a range of between, for example, approximately 1.5 and approximately 3.9. In some embodiments, the first etch stop layer 110 and the second etch stop layer 114 may each comprise, for example, silicon nitride, silicon carbide, or some other suitable etch stop material. In some embodiments, the first and/or second etch stop layers 110, 114 may comprise multiple layers of various materials.

Figure 5:
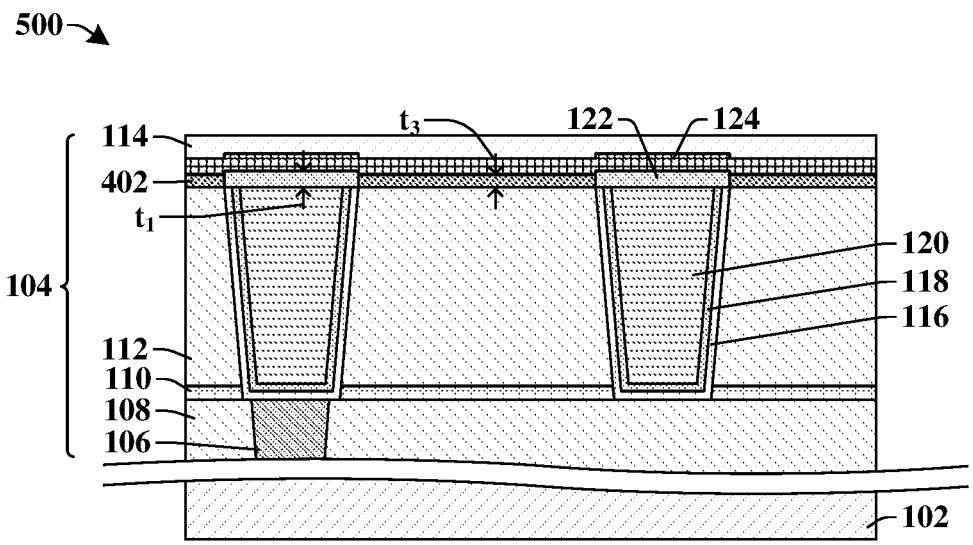

FIG. 5 illustrates a cross-sectional view 500 of some embodiments of an integrated chip comprising an interconnect structure having a first and second capping layer over a first conductive structure, wherein the second capping layer is arranged directly on the first capping layer and a protective layer.

In some embodiments, the second capping layer 124 is arranged over the protective layer 402 and the first capping layer 122. In such embodiments, the second capping layer 124 may not be selectively deposited over the first capping layer 122. In some embodiments, the second two-dimensional material of the second capping layer 124 is non-conductive. Further, in some embodiments, the third thickness $t_3$ of the protective layer 402 may be less than the first thickness $t_1$ of the first capping layer 122. In such embodiments, a bottommost surface of the second capping layer 124 may be below a topmost surface of the first capping layer 122.

Figure 6:
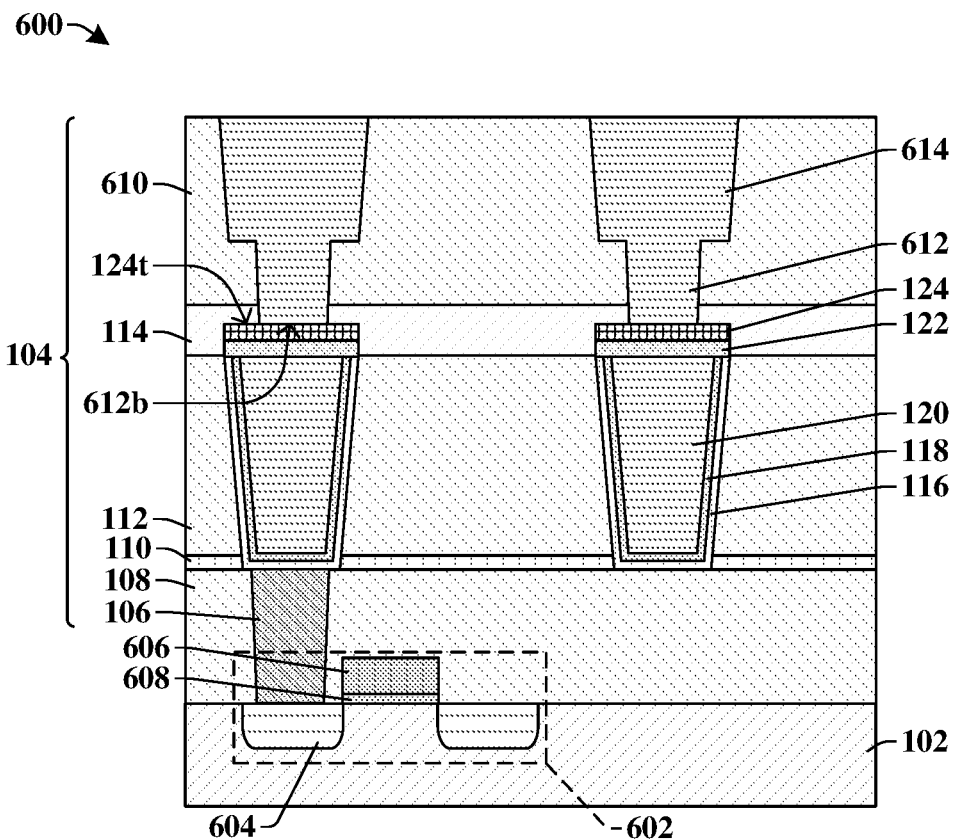
FIG. 6 illustrates a cross-sectional view of some embodiment of an integrated chip having a first capping layer and a second capping layer arranged over a topmost surface of a first interconnect conductive structure, wherein the first interconnect conductive structure is coupled to a semiconductor device, and wherein a second interconnect conductive structure overlies and is electrically coupled to the first interconnect conductive structure.

FIG. 6 illustrates a cross-sectional view 600 of some embodiments of an integrated chip comprising an interconnect structure having a first and second capping layer over a first conductive structure, wherein a second interconnect conductive structure is arranged over and coupled to the first conductive structure, and wherein a semiconductor device is coupled to and arranged below the first interconnect conductive structure.

In some embodiments, the lower interconnect via 106 is coupled to an underlying semiconductor device 602. In some embodiments, the underlying semiconductor device 602 may comprise, for example, a field effect transistor (FET). In such embodiments, the semiconductor device 602 may comprise source/drain regions 604 arranged on or within the substrate 102. The source/drain regions 604 may comprise doped portions of the substrate 102. Further, in some embodiments, the semiconductor device 602 may comprise a gate electrode 606 arranged over the substrate 102 and between the source/drain regions 604. In some embodiments, a gate dielectric layer 608 may be arranged directly between the gate electrode 606 and the substrate 102. In some embodiments, the lower interconnect via 106 is coupled to one of the source/drain regions 604, whereas in other embodiments, the lower interconnect via 106 may be coupled to the gate electrode 606 of the semiconductor device 602. Further in some embodiments, it will be appreciated that the interconnect structure 104 may couple the semiconductor device 602 to some other semiconductor device, memory device, photo device, or some other electronic device. It will be appreciated that other electronic/semiconductor devices other than the FET illustrated as the semiconductor device 602 are also within the scope of this disclosure, such as, for example, gate all around FETs, finFETs, or the like.

Further, in some embodiments, the interconnect structure 104 may comprise a second interconnect dielectric layer 610. In some embodiments, a second interconnect conductive structure 612 and a third interconnect conductive structure 614 arranged over the second interconnect conductive structure 612 extend through and are embedded in the second interconnect dielectric layer 610. In some embodiments, the second interconnect conductive structure 612 is an interconnect via, and the third interconnect conductive structure 614 is an interconnect wire. In some embodiments, the second and third interconnect conductive structures 612, 614 are formed by way of a dual damascene process.

In some embodiments, the second interconnect conductive structure 612 extends through the second etch stop layer 114 to electrically contact the first interconnect conductive structure 120. In some embodiments, a bottommost surface 612b of the second interconnect conductive structure 612 directly contacts a topmost surface 124t of the second capping layer 124. In some such embodiments, the first two-dimensional material of the first capping layer 122 and the second two-dimensional material of the second capping layer 124 may comprise conductive materials. Thus, in some such embodiments, although the second interconnect conductive structure 612 does not directly contact the first interconnect conductive structure 120, the second interconnect conductive structure 612 is electrically coupled to the first interconnect conductive structure 120 through the first and second capping layers 122, 124 comprising conductive materials.

Figure 7:
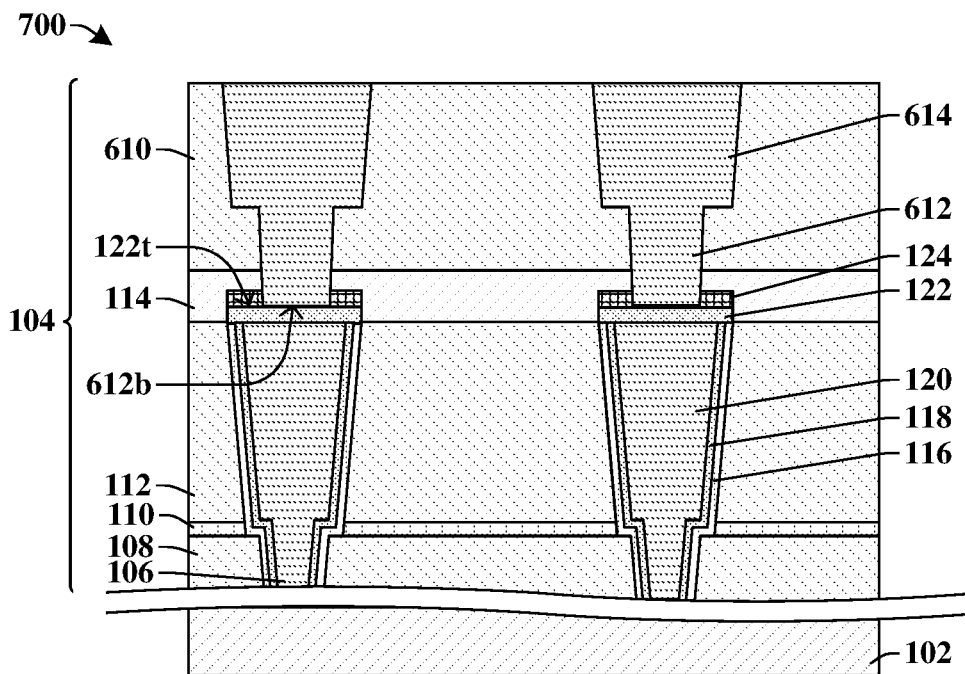
FIGS. 7 and 8 illustrate cross-sectional views of some other embodiments of an integrated chip having first and second capping layers arranged over a topmost surface of a first interconnect conductive structure and having a second interconnect conductive structure arranged over and electrically coupled to the first interconnect conductive structure.

FIG. 7 illustrates a cross-sectional view 700 of some other embodiments of an integrated chip comprising an interconnect structure having a first and second capping layer over a first conductive structure, wherein a second interconnect conductive structure is arranged over and extends through the second capping layer to contact the first capping layer.

In some embodiments, the second interconnect conductive structure 612 extends through the second capping layer 124 such that the bottommost surface 612b of the second interconnect conductive structure 612 directly contacts a topmost surface 122t of the first capping layer 122. In some such embodiments, the second two-dimensional material of the second capping layer 124 may be non-conductive. In some other embodiments, the second two-dimensional material of the second capping layer 124 may be conductive. Further, in some such embodiments, the first two-dimensional material of the first capping layer 122 may be conductive such that even though the second interconnect conductive structure 612 does not directly contact the first interconnect conductive structure 120, the first and second interconnect conductive structures 612, 120 are still electrically contacting one another.

Further, in some embodiments, the first interconnect conductive structure 120 may be continuously connected to the lower interconnect via 106. In some such embodiments, the first liner layer 118 and the first barrier layer 116 may also surround outermost sidewalls of the lower interconnect via 106. In some such embodiments, the first interconnect conductive structure 120 and the lower interconnect via 106 may have been formed through a dual damascene process. In some embodiments, the lower interconnect via 106, the first interconnect conductive structure 120, the second interconnect conductive structure 612, and the third interconnect conductive structure 614 may each comprise, for example, tungsten, copper, titanium, aluminum, tantalum, or some other suitable conductive material.

Figure 8:
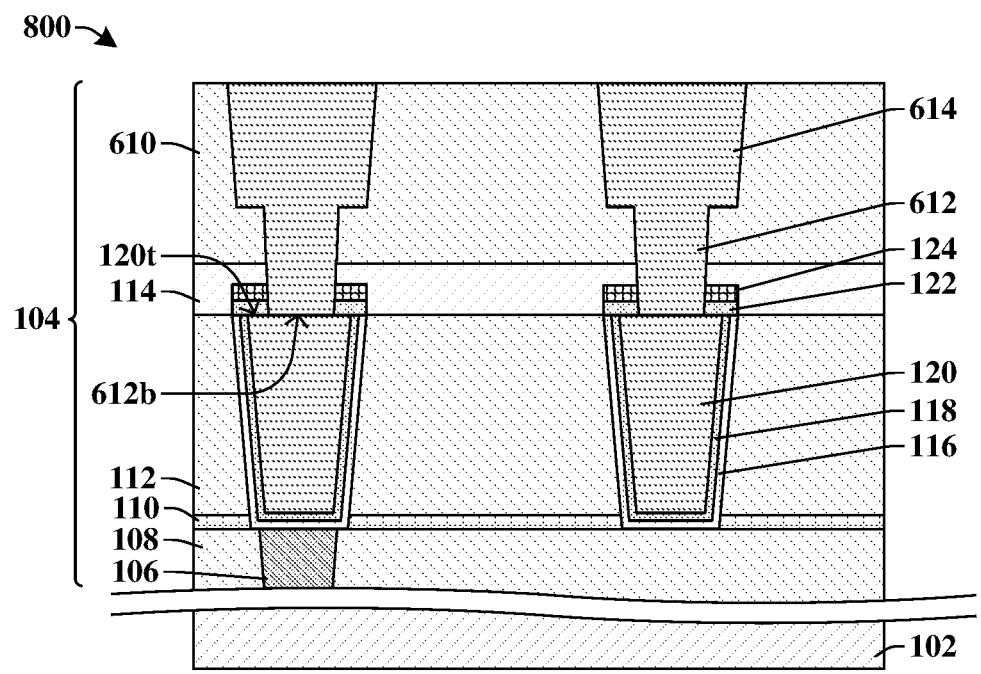

FIG. 8 illustrates a cross-sectional view 800 of some other embodiments of an integrated chip comprising an interconnect structure having a first and second capping layer over a first conductive structure, wherein a second interconnect conductive structure is arranged over and extends through the first capping layer and the second capping layer to contact the first interconnect conductive structure.

In some embodiments, the second interconnect conductive structure 612 extends through the second capping layer 124 and the first capping layer 122 such that the bottommost surface 612b of the second interconnect conductive structure 612 directly contacts a topmost surface 120t of the first interconnect conductive structure 120. In some such embodiments, the first two-dimensional material of the first capping layer 122 and the second two-dimensional material of the second capping layer 124 may be non-conductive. In some other embodiments, even if the first and/or second capping layers 122, 124 comprise a conductive material, the second interconnect conductive structure 612 may still extend through the first and second capping layers 122, 124 to directly contact the first interconnect conductive structure 120.

Because the topmost surface 120t of the first interconnect conductive structure 120 is covered by the first and second capping layers 122, 124 as well as, in some embodiments, the second interconnect conductive structure 612, electromigration and resistivity of the first interconnect conductive structure 120 are reduced, thereby increasing the reliability of the interconnect structure 104.

FIGS. 9-21 illustrate cross-sectional views 900-2100 of some embodiments of a method of forming an integrated chip having a first capping layer and a second capping layer arranged over a topmost surface of a first interconnect conductive structure to reduce resistivity and electromigration without sacrificing the structural integrity of the overall integrated chip. Although FIGS. 9-21 are described in relation to a method, it will be appreciated that the structures disclosed in FIGS. 9-21 are not limited to such a method, but instead may stand alone as structures independent of the method.

Figure 9:
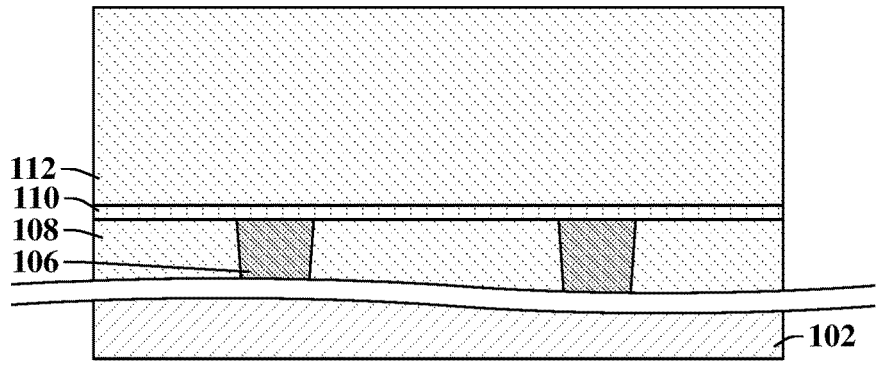
FIGS. 9-21 illustrate cross-sectional views of some embodiments of forming an integrated chip having a first capping layer and a second capping layer arranged over a topmost surface of a first interconnect conductive structure.

As shown in cross-sectional view 900 of FIG. 9, a substrate 102 is provided. In some embodiments, the substrate 102 may be or comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or associated with. In some embodiments, a lower interconnect dielectric layer 108 is formed over the substrate 102. In some embodiments, various semiconductor devices (e.g., transistors, inductors, capacitors, etc.) and/or memory devices (not shown) may be arranged over and/or within the substrate 102 and beneath the lower interconnect dielectric layer 108. In some embodiments, a lower interconnect via 106 may be formed within the lower interconnect dielectric layer 108 and coupled to the one or more of the various semiconductor devices and/or memory devices (not shown).

In some embodiments, the lower interconnect dielectric layer 108 may be formed by way of a deposition process (e.g., spin-on, physical vapor deposition (PVD), chemical vapor deposition (CVD), atomic layer deposition (ALD), etc.). In some embodiments, the lower interconnect dielectric layer 108 may comprise, for example, a low-k dielectric material (e.g., dielectric constant in a range of between about 1.5 and about 3.9) such as a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or some other suitable low-k dielectric material.

In some embodiments, the lower interconnect via 106 may be formed within the lower interconnect dielectric layer 108 through various steps of patterning (e.g., photolithography/etching), deposition (e.g., PVD, CVD, plasma-enhanced CVD (PE-CVD), ALD, sputtering, etc.), and removal (e.g., wet etching, dry etching, chemical mechanical planarization (CMP), etc.) processes. In some embodiments, the lower interconnect via 106 may comprise a conductive material such as, for example, tantalum, tantalum nitride, titanium nitride, copper, cobalt, ruthenium, molybdenum, iridium, tungsten, or some other suitable conductive material.

In some embodiments, a first etch stop layer 110 is formed over the lower interconnect via 106 and over the lower interconnect dielectric layer 108. In some embodiments, the first etch stop layer 110 is formed by way of a deposition process (e.g., PVD, CVD, ALD, spin-on, etc.). In some embodiments, the first etch stop layer 110 may comprise, for example, silicon carbide, silicon dioxide, silicon oxygen carbide, silicon nitride, silicon carbon nitride, silicon oxynitride, silicon oxygen carbon nitride, aluminum oxygen nitride, aluminum oxide, or some other suitable material. In some embodiments, the first etch stop layer 110 comprises a different material than the lower interconnect dielectric layer 108.

In some embodiments, a first interconnect dielectric layer 112 is formed by way of a deposition process (e.g., spin-on, PVD, CVD, ALD, etc.). In some embodiments, the first interconnect dielectric layer 112 may comprise, for example, a low-k dielectric material (e.g., dielectric constant in a range of between about 1.5 and about 3.9) such as a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or some other suitable low-k dielectric material. In some embodiments, the first interconnect dielectric layer 112 comprises a same material as the lower interconnect dielectric layer 108, whereas in other embodiments, the first interconnect dielectric layer 112 comprises a different material than the lower interconnect dielectric layer 108. Further, the first interconnect dielectric layer 112 comprises a different material than the first etch stop layer 110.

Figure 10:
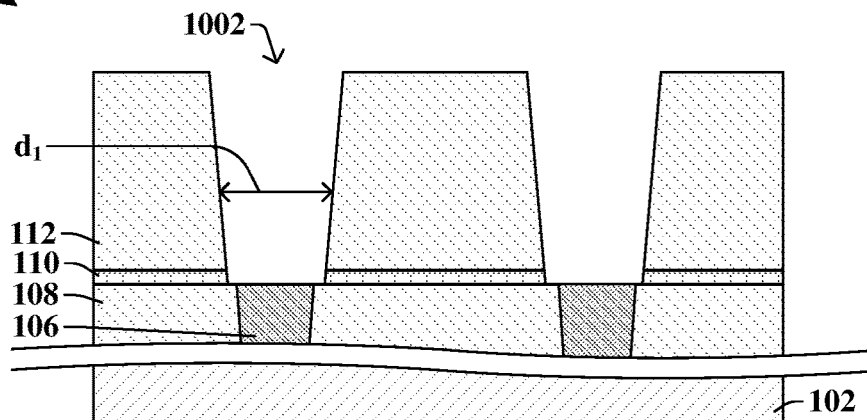

As shown in cross-sectional view 1000 of FIG. 10, in some embodiments, a removal process is performed to form openings 1002 in the first interconnect dielectric layer 112. In some embodiments, the removal process of FIG. 10 includes various steps of various steps of photolithography and removal (e.g., wet etching, dry etching, etc.) processes. In some embodiments, the openings 1002 have a width equal to a first distance $d_1$. In some embodiments, the first distance $d_1$ is in a range of between, for example, approximately 5 angstroms and approximately 500 angstroms. In some embodiments, the removal process of FIG. 10 also removes portions of the first etch stop layer 110 to expose the lower interconnect via 106. In some embodiments, two different etchants are used in the removal process of FIG. 10, wherein a first etchant removes portions of the first interconnect dielectric layer 112, and wherein a second etchant removes portions of the first etch stop layer 110. In such embodiments, the lower interconnect dielectric layer 108 is substantially resistant to the second etchant that removes the first etch stop layer 110.

Figure 11:
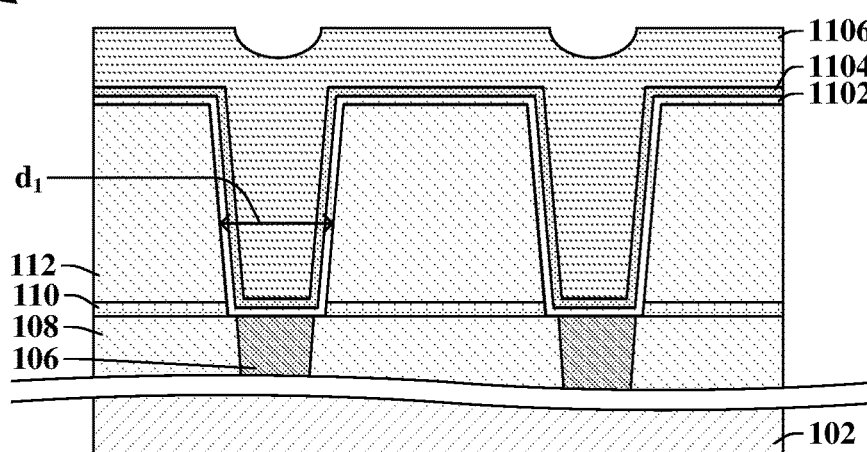

As shown in cross-sectional view 1100 of FIG. 11, in some embodiments, a first continuous barrier layer 1102 is formed within the openings (1002 of FIG. 10) of the first interconnect dielectric layer 112 and the first etch stop layer 110. In some embodiments, the first continuous barrier layer 1102 is formed by way of a deposition process (e.g., PVD, CVD, ALD, sputtering, etc.). In some embodiments, the first continuous barrier layer 1102 comprises, for example, tantalum, tantalum nitride, titanium, titanium nitride, tungsten nitride, or the like. Further, in some embodiments, a first continuous liner layer 1104 is formed over the first continuous barrier layer 1102. In some embodiments, the first continuous liner layer 1104 is formed over the first continuous barrier layer 1102. In some embodiments, the first continuous liner layer 1104 comprises, for example, copper, cobalt, ruthenium, tantalum, titanium, silicon nitride, or some other suitable material.

Further, in some embodiments, a first conductive material 1106 is formed over the first continuous liner layer 1104 to completely fill the openings (1002 of FIG. 10). In some embodiments, the first conductive material 1106 is formed by way of a deposition process (e.g., PVD, CVD, ALD, sputtering, etc.). In some embodiments, the first conductive material 1106 comprises, for example, tantalum, tantalum nitride, titanium nitride, copper, cobalt, aluminum, ruthenium, molybdenum, iridium, tungsten, or some other suitable conductive material.

Figure 12:
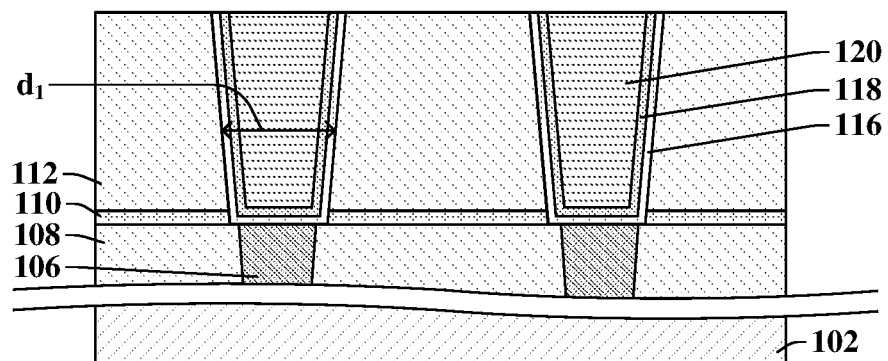

As shown in cross-sectional view 1200 of FIG. 12, in some embodiments, a planarization process (e.g., chemical mechanical planarization (CMP)) is performed to remove portions of the first continuous barrier layer (1102 of FIG. 11), the first continuous liner layer (1104 of FIG. 11), and the first conductive material (1106 of FIG. 11) arranged over the first interconnect dielectric layer 112. Thus, after the planarization process of FIG. 12, a first interconnect conductive structure 120 extends through the first interconnect dielectric layer 112 and is electrically coupled to the lower interconnect via 106. Further, in some embodiments, a first liner layer 118 is arranged on outer sidewalls and/or a bottom surface of the first interconnect conductive structure 120, and a first barrier layer 116 is arranged on outer sidewalls and/or a bottom surface of the first liner layer 118. In some embodiments, the first barrier layer 116 mitigates diffusion of the first interconnect conductive structure 120 to reduce cross-talk, and in some embodiments, the first liner layer 118 is a seed layer for formation of the first interconnect conductive structure 120 or a glue layer between the first interconnect conductive structure 120 and the first barrier layer 116. In some embodiments, a width of the first interconnect conductive structure 120 is about equal to the first distance $d_1$. In some other embodiments, an etching process may be used to remove portions of the first continuous barrier layer (1102 of FIG. 11), the first continuous liner layer (1104 of FIG. 11), and the first conductive material (1106 of FIG. 11) arranged over the first interconnect dielectric layer 112.

Figure 13A:
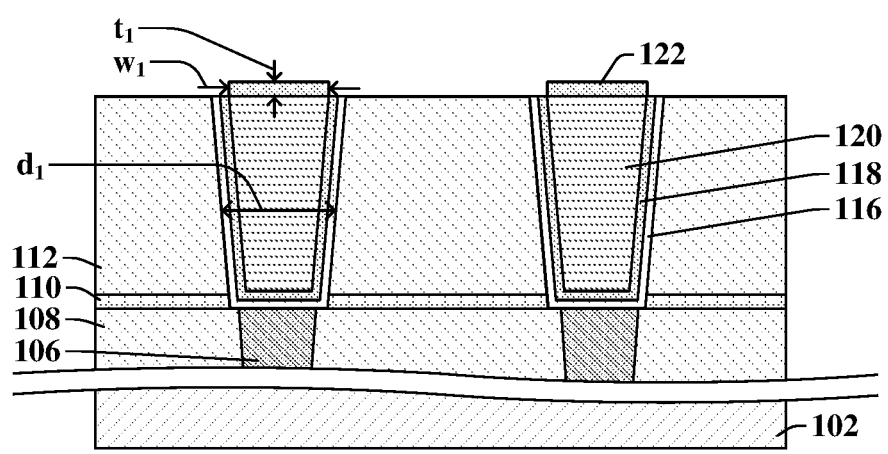

As shown in cross-sectional view 1300A of FIG. 13A, a first capping layer 122 is selectively formed over the first interconnect conductive structure 120. In some embodiments, the first capping layer 122 is formed by a deposition process (e.g., CVD, plasma-enhanced CVD (PE-CVD), ALD, etc.), an exfoliation and transfer process, a thermal formation process, or some other suitable process. Further, the first capping layer 122 is selectively formed on the first interconnect conductive structure 120. In other words, in some embodiments, the first capping layer 122 is formed directly on the first interconnect conductive structure 120 and is not formed on the first interconnect dielectric layer 112. In some embodiments, the selective formation or selective deposition is based on a pre-treatment technique to activate or deactivate certain layers such that the first capping layer 122 is selectively formed on the first interconnect conductive structure 120. In some embodiments, the first capping layer 122 may contact the first liner layer 118 and/or the first barrier layer 116, depending on the selective deposition pre-treatment technique. It will be appreciated that other techniques of selective deposition are also within the scope of this disclosure. In some embodiments, by using selective deposition to form the first capping layer 122, waste of the first two-dimensional material and damage to the first interconnect dielectric layer 112 are mitigated.

In some embodiments, the first capping layer 122 comprises a first two-dimensional material. The first two-dimensional material of the first capping layer 122 comprises a material that mitigates resistivity and electromigration of the first interconnect conductive structure 120 to increase the reliability of the integrated chip. The first two-dimensional material of the first capping layer 122 may have a planar, hexagonal structure, such as, for example, graphene, hexagonal boron nitride, molybdenum sulfide, tantalum sulfide, hafnium sulfide, tungsten selenide, borocarbonates, germanane, $Ni_3(HITP)_2$, or some other suitable material with a two-dimensional crystal structure. In some embodiments, if the first two-dimensional material of the first capping layer 122 comprises graphene, the first two-dimensional material of the first capping layer 122 may be intercalated graphene, nitrogen doped graphene, oxygen doped graphene, or modified graphene. In some embodiments, the intercalated material of intercalated graphene may be, for example, a metal ion (e.g., lithium, potassium, cesium, sodium, etc.), organic compounds (e.g., benzene, pyridine, furan, catechol, etc.), inorganic compounds (e.g., $FeCl_3$, $MoCl_5$, $AuCl_3$, $CuCl_2$, $H_2SO_4$, $AlCl_3$, $Br_2$, $Cl_2$, $HNO_3$, etc.), polymers/oligomer (e.g., poly(methyl methacrylate), polystyrene, nylon 6, etc.), a combination thereof, or the like. It will be appreciated that other materials of the first two-dimensional material are also within the scope of the disclosure. For example, in some embodiments, the first two-dimensional material of the first capping layer 122 may be further modified from the above exemplary materials by way of plasma treatments and/or precursor adjustments.

In some embodiments, for example when the first capping layer 122 comprises graphene, the first capping layer 122 is formed in a chamber using a carbon-hydrogen precursor (e.g., $CH_4$, $C_2H_4$, $C_2H_2$, etc.), set to a temperature in a range of between, for example, approximately 273 Kelvin and approximately 773 Kelvin, and set to a pressure in a range of between, for example $10^{-10}$ Torr to approximately $10^{-9}$ Torr. It will be appreciated that other processing conditions for graphene are also within the scope of this disclosure.

In some embodiments, the first capping layer 122 has a first thickness $t_1$ in a range of between, for example, approximately 3 angstroms and approximately 300 angstroms. In some embodiments, the first capping layer 122 has a first width $w_1$ in a range of between, for example, approximately 5 angstroms and approximately 500 angstroms. In some embodiments, the first thickness $t_1$ of the first capping layer 122 is so small (e.g., about 3 angstroms) at least in part because the first capping layer 122 comprises the first two-dimensional material. Thus, the first capping layer 122 does not add a significant height to the integrated chip.

Figure 13B:
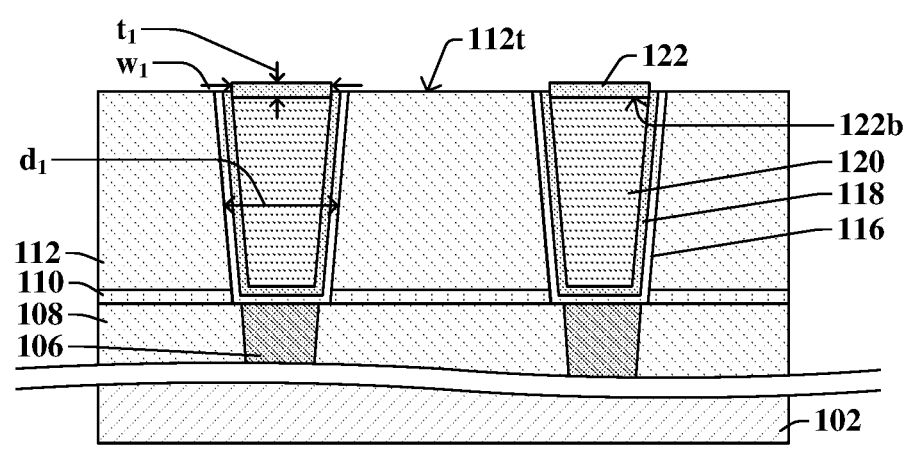

FIG. 13B illustrates a cross-sectional view 1300B some alternative embodiments of FIG. 13A after the formation of the first capping layer 122 on the first interconnect conductive structure 120.

As shown in the cross-sectional view 1300B of FIG. 13B, in some embodiments, the first capping layer 122 reacts with the first interconnect conductive structure 120 during the selective formation of the first capping layer 122. Thus, in some embodiments, a bottommost surface 122b of the first capping layer 122 is arranged below a topmost surface 112t of the first interconnect dielectric layer 112. In some other embodiments, the bottommost surface 122b of the first capping layer 122 is arranged below the topmost surface 112t of the first interconnect dielectric layer 112 because an etching process is used in FIG. 12 to form the first interconnect conductive structure 120. In some such embodiments, when an etching process is used to form the first interconnect conductive structure 120, the first interconnect conductive structure 120 may be etched below the topmost surface 112t of the first interconnect dielectric layer 112. As a result, in such other embodiments, the bottommost surface 122b of the first capping layer 122 is arranged below the topmost surface 112t of the first interconnect dielectric layer 112.

Figure 14A:
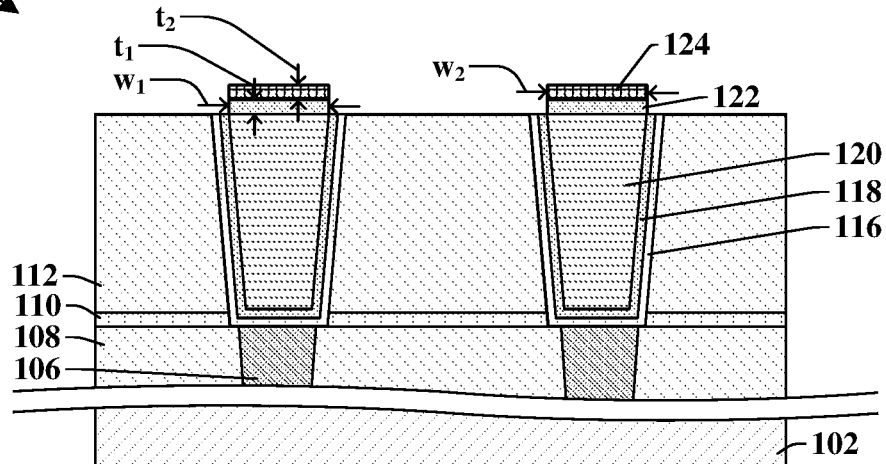

As shown in cross-sectional view 1400A of FIG. 14A, a second capping layer 124 is selectively formed over the first capping layer 122. In some embodiments, the second capping layer 124 comprises a second two-dimensional material that is different than the first two-dimensional material of the first capping layer 122. In some embodiments, the second capping layer 124 may be formed by a selective deposition process such that the second capping layer 124 directly contacts the first capping layer 122 but does not contact the first interconnect dielectric layer 112. In some embodiments, the second capping layer 124 is formed by a deposition process (e.g., CVD, plasma-enhanced CVD (PE-CVD), ALD, etc.), an exfoliation and transfer process, a thermal formation process, or some other suitable process.

In some embodiments, the second two-dimensional material of the second capping layer 124 may have a planar, hexagonal structure, such as, for example, graphene, hexagonal boron nitride, molybdenum sulfide, tantalum sulfide, hafnium sulfide, tungsten selenide, borocarbonates, germanane, $Ni_3(HITP)_2$, or some other suitable material with a two-dimensional crystal structure. In some embodiments, the second capping layer 124 comprises an organic material, an inorganic material, a two-dimensional material, and or a mixture of the aforementioned materials. In some embodiments, if the second two-dimensional material of the second capping layer 124 comprises graphene, the second two-dimensional material of the second capping layer 124 may be, for example, intercalated graphene, nitrogen doped graphene, oxygen doped graphene, or modified graphene. In some embodiments, the intercalated material of intercalated graphene may be, for example, a metal ion (e.g., lithium, potassium, cesium, sodium, etc.), organic compounds (e.g., benzene, pyridine, furan, catechol, etc.), inorganic compounds (e.g., $FeCl_3$, $MoCl_5$, $AuCl_3$, $CuCl_2$, $H_2SO_4$, $AlCl_3$, $Br_2$, $Cl_2$, $HNO_3$, etc.), polymers/oligomer (e.g., poly(methyl methacrylate), polystyrene, nylon 6, etc.), a combination thereof, or the like. It will be appreciated that other materials of the second two-dimensional material are also within the scope of the disclosure. For example, in some embodiments, the second two-dimensional material of the second capping layer 124 may be further modified from the above exemplary materials by way of plasma treatments and/or precursor adjustments.

In some embodiments, for example when the second capping layer 124 comprises graphene, the first capping layer 122 is formed in a chamber using a carbon-hydrogen precursor (e.g., $CH_4$, $C_2H_4$, $C_2H_2$, etc.), set to a temperature in a range of between, for example, approximately 273 Kelvin and approximately 773 Kelvin, and set to a pressure in a range of between, for example $10^{-10}$ Torr to approximately $10^{-9}$ Torr. It will be appreciated that other processing conditions for graphene are also within the scope of this disclosure.

In some embodiments, the second capping layer 124 has a second thickness $t_2$ in a range of between, for example, approximately 3 angstroms and approximately 300 angstroms. In some embodiments, the second capping layer 124 has a second width $w_2$ in a range of between, for example, approximately 5 angstroms and approximately 500 angstroms. In some embodiments, the second thickness $t_2$ of the second capping layer 124 is so small (e.g., about 3 angstroms) at least in part because the second capping layer 124 comprises the second two-dimensional material. Thus, the second capping layer 124 does not add a significant height to the integrated chip.

Figure 14B:
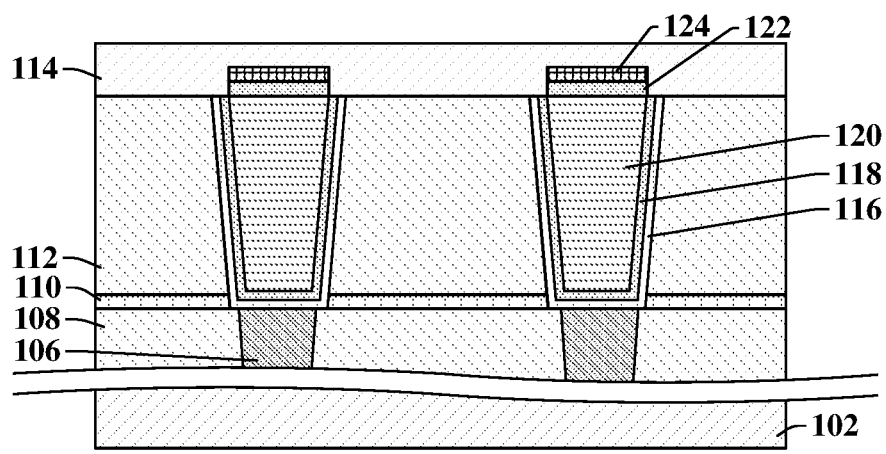

As shown in cross-sectional view 1400B of FIG. 14B, in some embodiments, a second etch stop layer 114 is formed over the first interconnect dielectric layer 112 and the second capping layer 124. In some embodiments, the second etch stop layer 114 may comprise, for example, silicon carbide, silicon dioxide, silicon oxygen carbide, silicon nitride, silicon carbon nitride, silicon oxynitride, silicon oxygen carbon nitride, aluminum oxygen nitride, aluminum oxide, or some other suitable material. In some embodiments, the second etch stop layer 114 comprises a different material than the first interconnect dielectric layer 112. In some embodiments, the second etch stop layer 114 is formed by way of a deposition process (e.g., PVD, CVD, ALD, spin-on, etc.). In some embodiments, a removal process, such as a planarization process (e.g., CMP) may be performed after the deposition process such that the second etch stop layer 114 has a substantially planar upper surface. In some embodiments, the second etch stop layer 114 completely covers the second capping layer 124.

In some embodiments, the second etch stop layer 114 adheres better to the second capping layer 124 than the second etch stop layer 114 would have adhered to the first capping layer 122 if the second capping layer 124 were omitted. Thus, in some embodiments, the second capping layer 124 and the second etch stop layer 114 comprise materials that adhere well to one another. Further, in some embodiments, the second two-dimensional material of the second capping layer 124 also adheres well to the first two-dimensional material of the first capping layer 122. Thus, in some embodiments, the second capping layer 124 acts as a glue layer between the first capping layer 122 and the second etch stop layer 114.

Figure 15A:
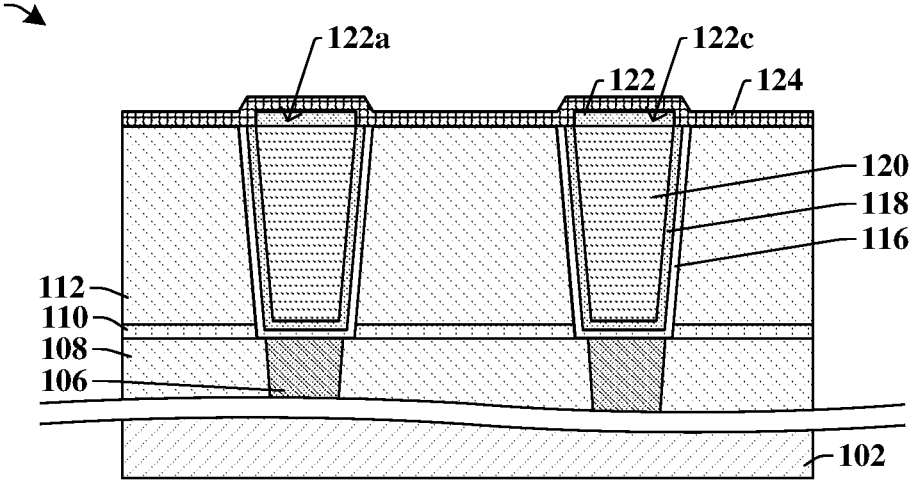
Figure 15B:
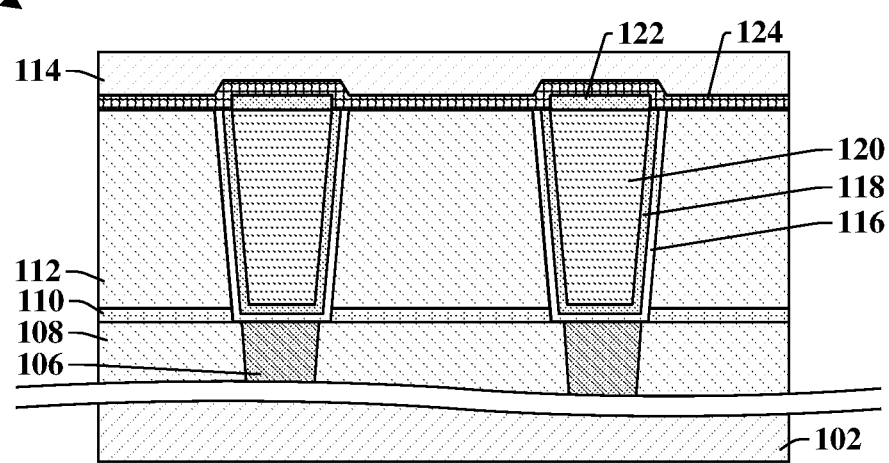

FIGS. 15A and 15B illustrate some other embodiments of forming the second capping layer 124 and the second etch stop layer 114 over the first capping layer 122. Thus, in some other embodiments, the method may proceed from FIG. 13A or 13B to FIG. 15A, thereby foregoing the steps illustrated in FIGS. 14A and 14B.

As shown in cross-sectional view 1500A of FIG. 15A, the second capping layer 124 is formed over the first capping layer 122, the first liner layer 118, the first barrier layer 116, and the first interconnect dielectric layer 112. Thus, in some embodiments, the second capping layer 124 is a continuous layer that completely covers the first interconnect dielectric layer 112. In such embodiments, the second capping layer 124 is wider than the first capping layer 122. In such embodiments, the second capping layer 124 is not selectively deposited over just the first capping layer 122. In some such embodiments, the second capping layer 124 laterally surrounds the first capping layer 122. In some embodiments, wherein more than one first interconnect conductive structure 120 is arranged in the first interconnect dielectric layer 112, the second capping layer 124 may continuously extend over and between more than one of the first capping layers 122. In other words, in some embodiments, the second capping layer 124 extends over a first one of the first capping layers 122a and a second one of the first capping layers 122c, and the first one of the first capping layers 122a is spaced apart from the second one of the first capping layers 122c by the second capping layer 124.

In some such embodiments, the second capping layer 124 comprises the second two-dimensional material, and the second two-dimensional material is not conductive. Thus, the second capping layer 124 does not interfere with the electrical isolation between more than one of the first interconnect conductive structures 120 embedded in the first interconnect dielectric layer 112.

As shown in cross-sectional view 1500B of FIG. 15B, the second etch stop layer 114 is formed over the second capping layer 124.

Figure 16A:
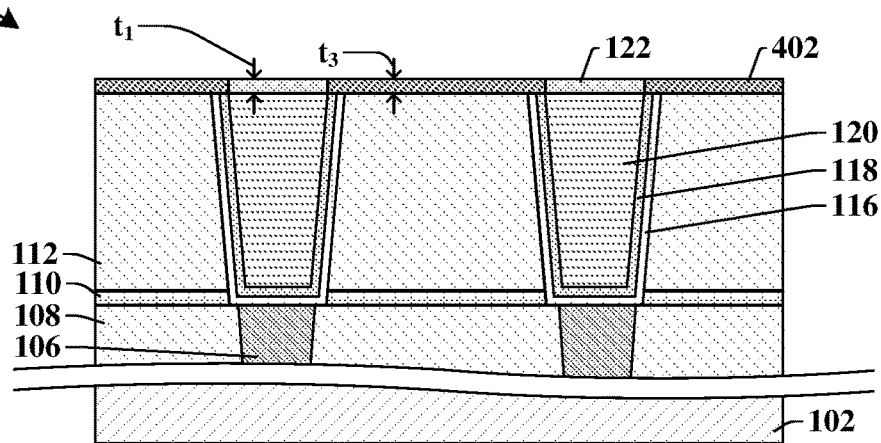
Figure 16B:
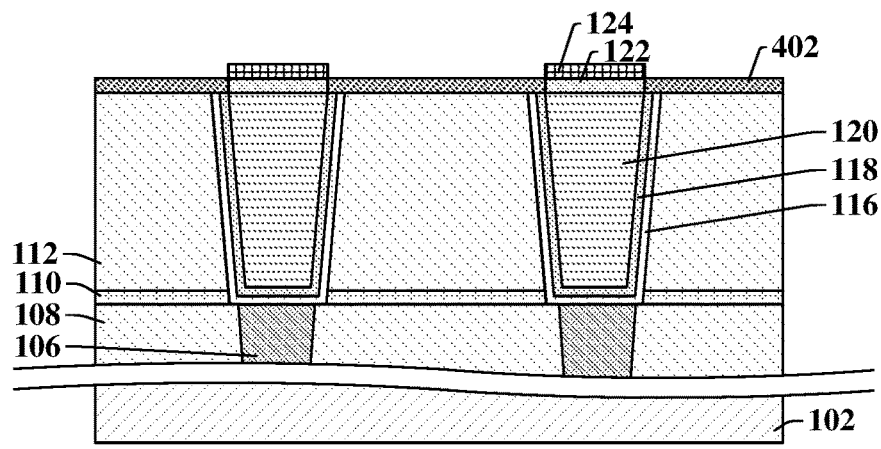
Figure 16C:
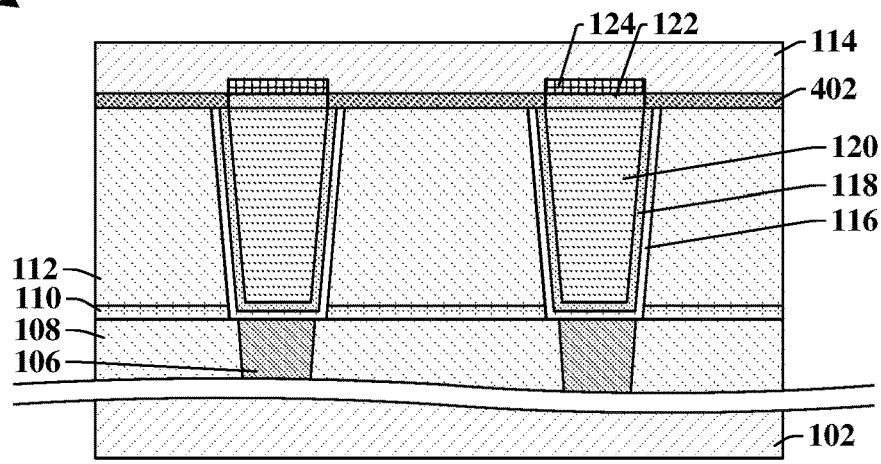

FIGS. 16A, 16B, and 16C illustrate yet some other embodiments of forming the second capping layer 124 and the second etch stop layer 114 over the first capping layer 122. Thus, in yet some other embodiments, the method may proceed from FIG. 13A or 13B to FIG. 16A, thereby foregoing the steps illustrated in FIGS. 14A, 14B, 15A, and 15B.

As shown in cross-sectional view 1600A of FIG. 16A, prior to forming a second capping layer (e.g., 124 of FIG. 16B) over the first capping layer 122, a protective layer 402 is selectively formed over the first interconnect dielectric layer 112. In some embodiments, the protective layer 402 is also selectively formed over the first liner layer 118 and the first barrier layer 116. In some embodiments, the selective formation of the protective layer 402 may be achieved using the same or similar methods as previously described in FIG. 13A for the selective formation of the first capping layer 122. For example, in some embodiments, the protective layer 402 may be selectively formed over the first interconnect dielectric layer 112 by way of ALD, CVD, thermal formation processes, spin-coating, or the like.

In some embodiments, the protective layer 402 may comprise, for example, a nitride (e.g., silicon nitride), an oxide (e.g., silicon dioxide, silicon oxynitride), or some other suitable dielectric material that has a dielectric constant in a range of between, for example, approximately 1.5 and approximately 3.9. In some embodiments, the protective layer 402 has a third thickness $t_3$ in a range of between, for example, approximately 1 angstrom and approximately 500 angstroms. Thus, in some embodiments, the third thickness $t_3$ of the protective layer 402 may be less than, equal to, or greater than the first thickness $t_1$ of the first capping layer 122. In some embodiments, the protective layer 402 is selectively formed over the first interconnect dielectric layer 112 to protect the first interconnect dielectric layer 112 from damage from future processing steps, such as the selective deposition of the second capping layer 124 to be described in FIG. 16B.

As shown in cross-sectional view 1600B of FIG. 16B, in some embodiments, the second capping layer 124 is then selectively formed over the first capping layer 122 and not the protective layer 402. In some embodiments, if the protective layer 402 is thicker than the first capping layer 122, the protective layer 402 may laterally surround outer sidewalls of the second capping layer 124.

As shown in cross-sectional view 1600C of FIG. 16C, the second etch stop layer 114 is formed over the second capping layer 124 and the protective layer 402.

Figure 17A:
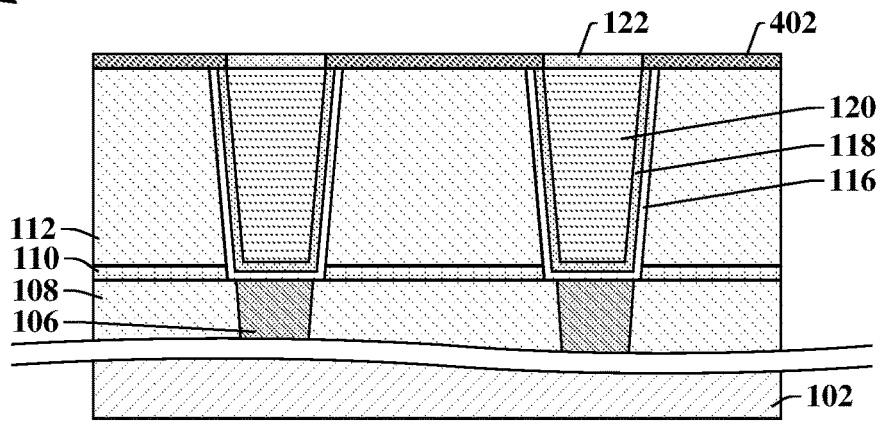
Figure 17B:
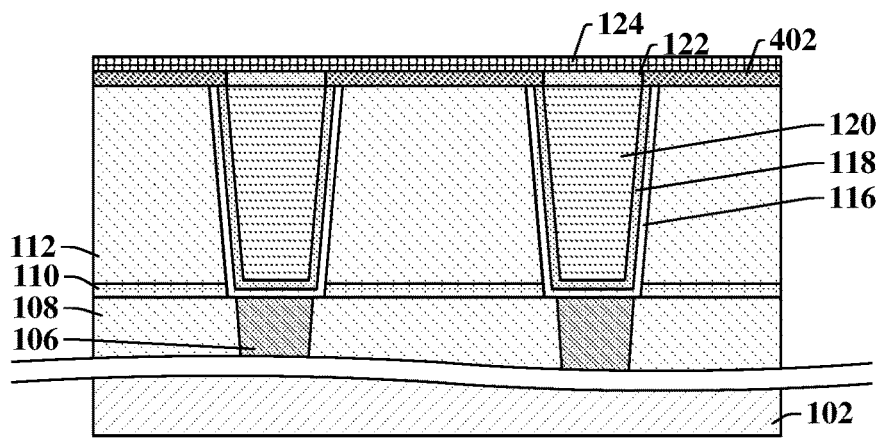
Figure 17C:
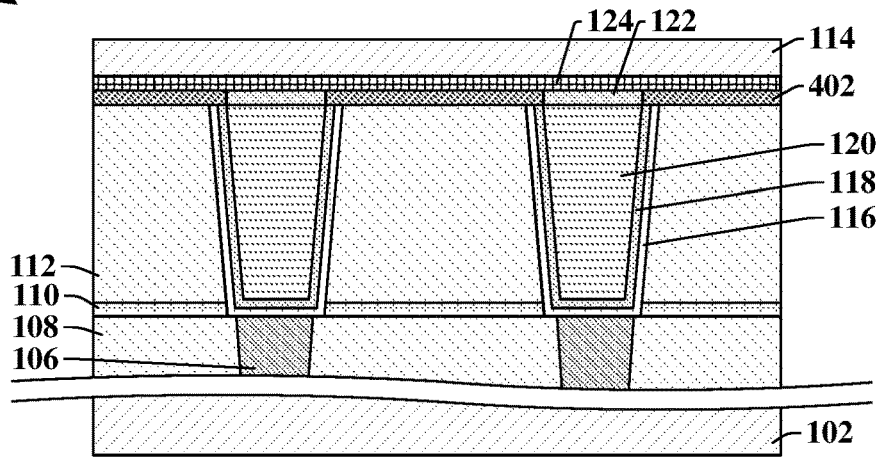

FIGS. 17A, 17B, and 17C illustrate yet some other embodiments of forming the second capping layer 124 and the second etch stop layer 114 over the first capping layer 122. Thus, in yet some other embodiments, the method may proceed from FIG. 13A or 13B to FIG. 17A, thereby foregoing the steps illustrated in FIGS. 14A, 14B, 15A, 15B, 16A, 16B, and 16C.

As shown in cross-sectional view 1700A of FIG. 17A, in some embodiments, the protective layer 402 is selectively formed over the first interconnect dielectric layer 112 as described in FIG. 16A.

As shown in cross-sectional view 1700B of FIG. 17B, the second capping layer 124 is formed over the protective layer 402 and the first capping layer 122. In some such embodiments, the second capping layer 124 is a continuous layer formed over the first capping layer 122 and the protective layer 402. Thus, in some such embodiments, the second capping layer 124 is not selectively formed over just the first capping layer 122. In some such embodiments, to maintain isolation of the first interconnect conductive structure(s) 120 embedded in the first interconnect dielectric layer 112, the second two-dimensional material of the second capping layer 124 is not conductive.

As shown in cross-sectional view 1700C of FIG. 17C, the second etch stop layer 114 is formed over the second capping layer 124 and the protective layer 402.

Figure 18:
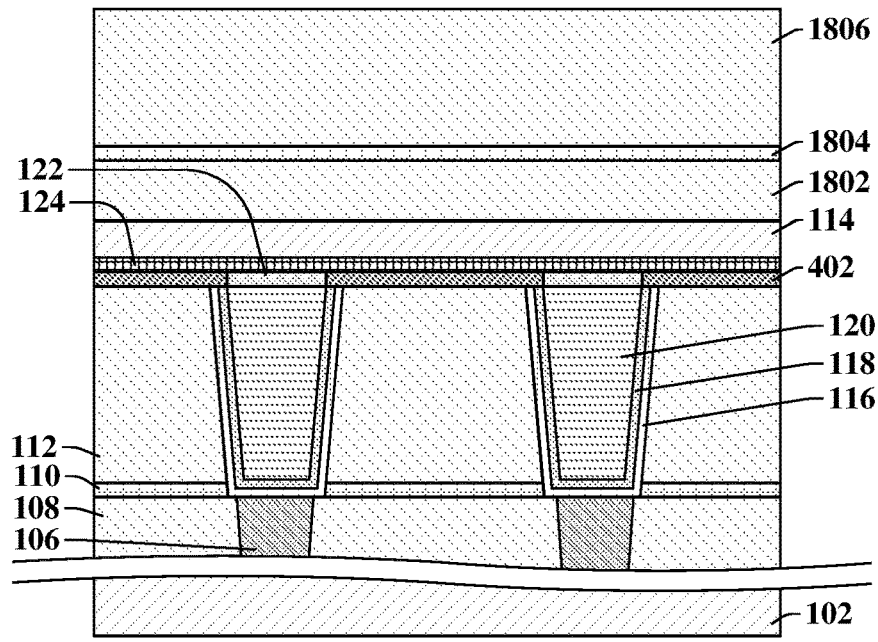

After the formation of the second etch stop layer 114, in some embodiments, the method may then proceed from FIG. 14B to FIG. 18, from FIG. 15B to FIG. 18, from FIG. 16C to FIG. 18, or from FIG. 17C to FIG. 18. The cross-sectional view 1800 of FIG. 18 illustrates embodiments wherein the method proceeds from FIG. 17C to FIG. 18. It will be appreciated that the steps in the method of FIGS. 18-21 may be applied to the embodiments illustrated in FIGS. 14B, 15B, and 16C, as well.

As shown in the cross-sectional view 1800 of FIG. 18, in some embodiments, a first upper interconnect dielectric layer 1802 is formed over the second etch stop layer 114; a third etch stop layer 1804 is formed over the first upper interconnect dielectric layer 1802; and a second upper interconnect dielectric layer 1806 is formed over the third etch stop layer 1804. In some embodiments, the first upper interconnect dielectric layer 1802, the third etch stop layer 1804, and the second upper interconnect dielectric layer 1806 may each be formed by way of a deposition process (e.g., PVD, CVD, ALD, etc.). In some embodiments, the first and second upper interconnect dielectric layers 1802, 1806 may comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or some other low-k dielectric material having a dielectric constant in a range of between, for example, approximately 1.5 and approximately 3.9. In some embodiments, the third etch stop layer 1804 may each comprise, for example, silicon nitride, silicon carbide, or some other suitable etch stop material. In some other embodiments, the third etch stop layer 1804 and/or the second upper interconnect dielectric layer 1806 may be omitted.

Figure 19:
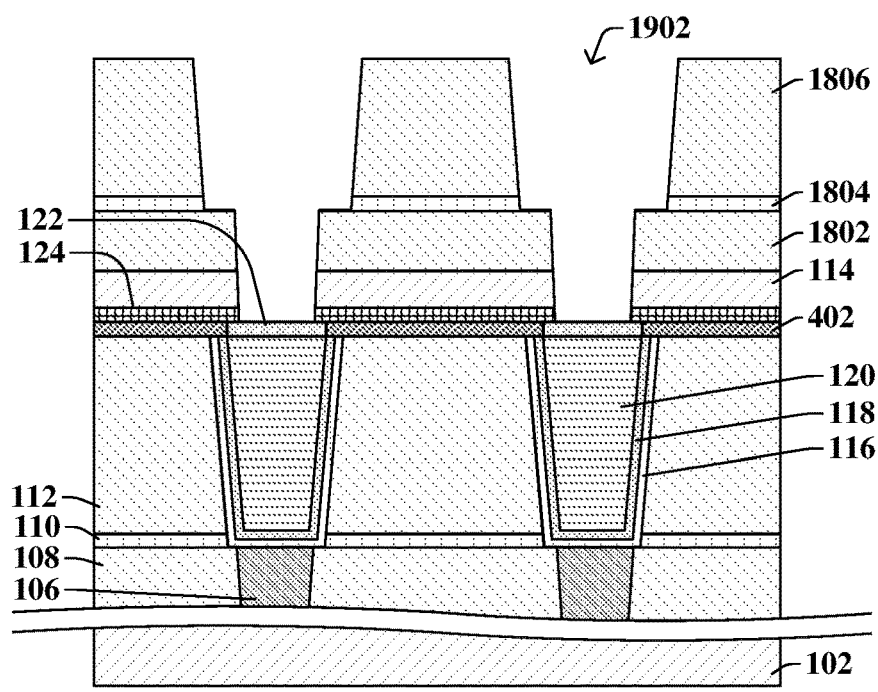

As shown in cross-sectional view 1900 of FIG. 19, in some embodiments, a removal process is performed to form openings 1902 in the second upper interconnect dielectric layer 1806, the third etch stop layer 1804, the first upper interconnect dielectric layer 1802, and the second etch stop layer 114. In some embodiments, the openings 1902 also extend through the second capping layer 124 to expose the first capping layer 122. In some other embodiments, the openings 1902 may also extend through the first capping layer 122 to expose the first interconnect conductive structure 120. For example, in some embodiments, wherein the first and second capping layers 122, 124 are not conductive, the openings 1902 may extend through the first and second capping layers 122, 124. In some embodiments, the removal process of FIG. 19 includes various steps of various steps of photolithography and removal (e.g., wet etching, dry etching, etc.) processes. In some embodiments, multiple etchants are used to remove portions of the different materials of in the second upper interconnect dielectric layer 1806, the third etch stop layer 1804, the first upper interconnect dielectric layer 1802, the second etch stop layer 114 and/or the second capping layer 124.

It will be appreciated that in some embodiments, the openings 1902 have varying widths by using multiple photolithography and removal processes as a part of a dual damascene process to simultaneously form an interconnect wire and an interconnect via within a dielectric structure (e.g., in the second upper interconnect dielectric layer 1806, the third etch stop layer 1804, and the first upper interconnect dielectric layer 1802).

Figure 20:
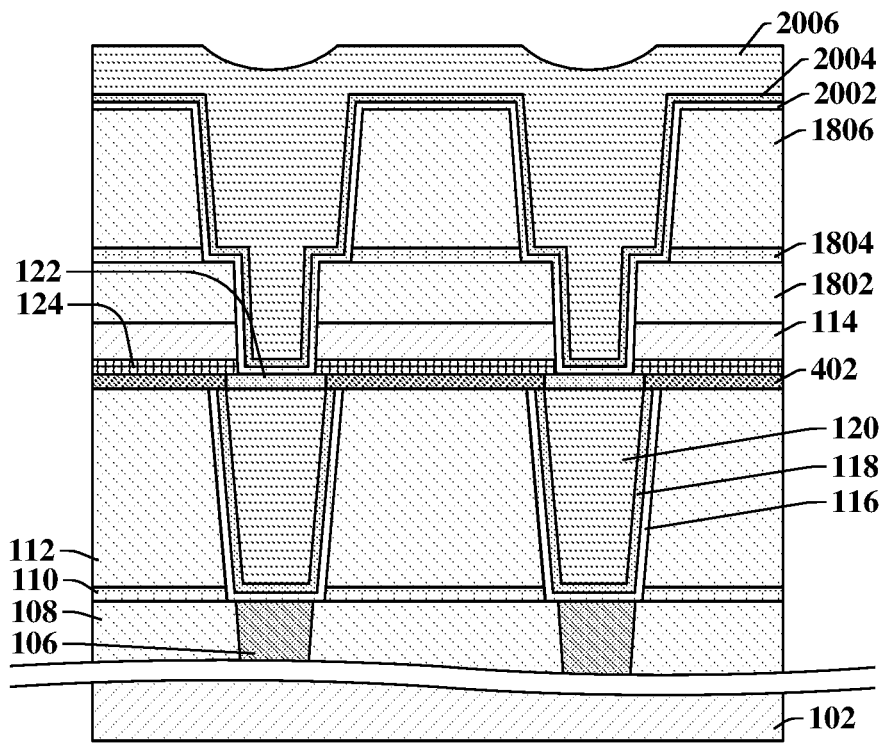

As shown in cross-sectional view 2000 of FIG. 20, a second continuous barrier layer 2002, a second continuous liner layer 2004, and a second conductive material 2006 are formed within the openings (1902 of FIG. 19). In some embodiments, the second continuous barrier layer 2002, the second continuous liner layer 2004, and the second conductive material 2006 may comprise a same or similar material as the first continuous barrier layer (1102 of FIG. 11), the first continuous liner layer (1104 of FIG. 11), and the first conductive material (1106 of FIG. 11), respectively. Further, in some embodiments, the second continuous barrier layer 2002, the second continuous liner layer 2004, and the second conductive material 2006 may be formed through a same or similar deposition process as the first continuous barrier layer (1102 of FIG. 11), the first continuous liner layer (1104 of FIG. 11), and the first conductive material (1106 of FIG. 11), respectively.

Figure 21:
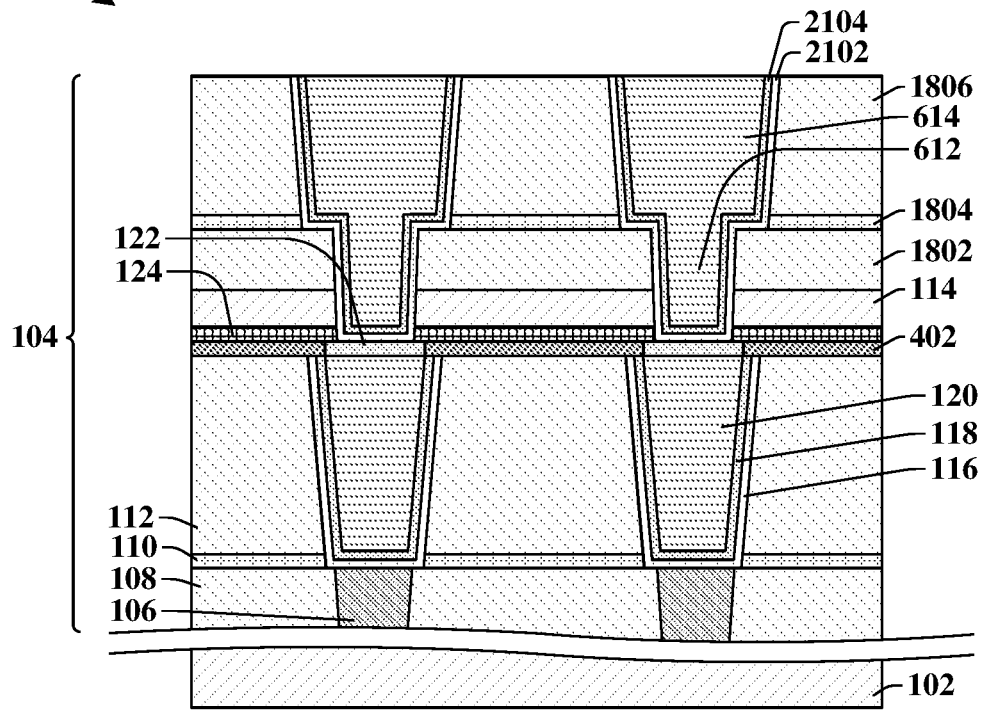

As shown in cross-sectional view 2100 of FIG. 21, a planarization process (e.g., chemical mechanical planarization (CMP)) is performed to remove portions of the second continuous barrier layer (2002 of FIG. 20), the second continuous liner layer (2004 of FIG. 20), and the second conductive material (2006 of FIG. 20) arranged over the second upper interconnect dielectric layer 1806. Thus, after the planarization process of FIG. 21, a second interconnect conductive structure 612 and a third interconnect conductive structure 614 extend through the second upper interconnect dielectric layer 1806, the third etch stop layer 1804, the first upper interconnect dielectric layer 1802, the second etch stop layer 114, and the second capping layer 124 and are electrically coupled to the first interconnect conductive structure 120. Further, in some embodiments, a second liner layer 2104 is arranged on outer sidewalls and/or a bottom surface of the second and third interconnect conductive structures 612, 614, and a second barrier layer 2102 is arranged on outer sidewalls and/or a bottom surface of the second liner layer 2104.

In some embodiments, the lower interconnect via 106, the interconnect conductive structures (e.g., 120, 612, 614), the dielectric layers (e.g., 108, 112, 402, 1802, 1806), the etch stop layers (e.g., 110, 114, 1804), the barrier and liner layers (e.g., 116, 118, 2102, 2104), and the capping layers (122, 124) form an interconnect structure 104 over the substrate 102 that provides conductive pathways between various electronic devices (e.g., semiconductor devices, photo devices, memory devices, etc.) arranged above and below the interconnect structure 104.

At least because of the first and second capping layers 122, 124, resistivity and electromigration of the first interconnect conductive structure 120 are reduced without causing any adhesion issues in the interconnect structure 104. It will be appreciated that the first and second capping layers 122, 124 may also be formed on other conductive structures (e.g., 106, 612, 614) of the interconnect structure 104 to further increase the resistivity and electromigration of the interconnect structure 104, thereby increasing the reliability of the interconnect structure 104. Thus, signals (e.g., current voltage) may be more reliably transported between various electronic devices (e.g., semiconductor devices, photo devices, memory devices, etc.) arranged above and below the interconnect structure 104.

Figure 22:
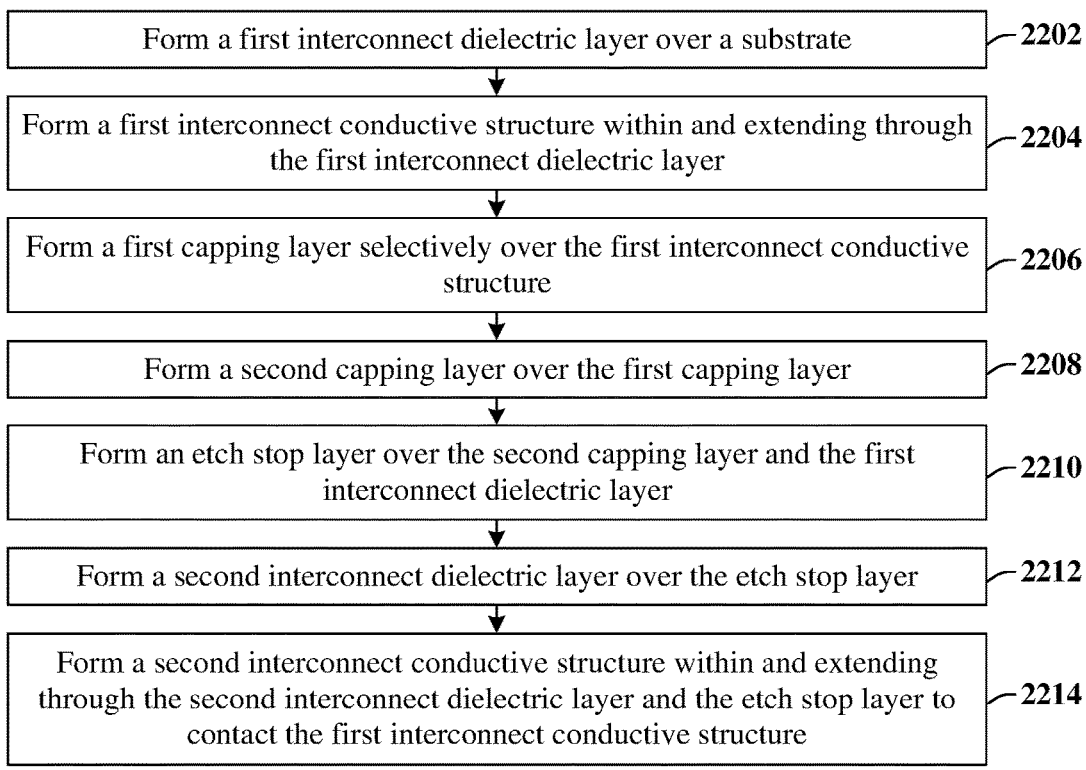
FIG. 22 illustrates a flow diagram of some embodiments of a method corresponding to FIGS. 9-21.

FIG. 22 illustrates a flow diagram of some embodiments of a method 2200 corresponding to the method illustrated in FIGS. 9-21.

While method 2200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2202, a first interconnect dielectric layer is formed over a substrate. FIG. 9 illustrates a cross-sectional view 900 of some embodiments corresponding to act 2202.

At act 2204, a first interconnect conductive structure is formed within and extending through the first interconnect dielectric layer. FIG. 12 illustrates a cross-sectional view 1200 of some embodiments corresponding to act 2204.

At act 2206, a first capping layer is selectively formed over the first interconnect conductive structure. FIG. 13A illustrates a cross-sectional view 1300A of some embodiments corresponding to act 2206.

At act 2208, a second capping layer is formed over the first capping layer. FIGS. 14A, 15A, 16B, and 17B illustrate cross-sectional views 1400A, 1500A, 1600B, and 1700B, respectively, of various embodiments that may correspond to act 2208.

At act 2210, an etch stop layer is formed over the second capping layer and the first interconnect dielectric layer. FIGS. 14B, 15B, 16C, and 17C illustrate cross-sectional views 1400B, 1500B, 1600C, and 1700C, respectively, of various embodiments that may correspond to act 2210.

At act 2212, a second interconnect dielectric layer is formed over the etch stop layer. FIG. 18 illustrates a cross-sectional view 1800 of some embodiments corresponding to act 2212.

At act 2214, a second interconnect conductive structure is formed within and extending through the second interconnect dielectric layer and the etch stop layer to contact the first interconnect conductive structure. FIG. 21 illustrates a cross-sectional view 2100 of some embodiments corresponding to act 2214.

Therefore, the present disclosure relates to a method of selectively forming a first capping layer over a first interconnect conductive structure in an interconnect structure to reduce resistivity and electromigration of the first interconnect conductive structure and forming a second capping layer over the first capping layer to reduce adhesion issues that may result without the second capping layer between the first capping layer and other overlying layers in the interconnect structure.

Accordingly, in some embodiments, the present disclosure relates to an integrated chip comprising: a first interconnect dielectric layer arranged over a substrate; a first interconnect conductive structure extending through the first interconnect dielectric layer; a first capping layer arranged over the first interconnect conductive structure, wherein the first capping layer comprises a first two-dimensional material; a second capping layer arranged over the first capping layer, wherein the second capping layer comprises a second two-dimensional material different than the first two-dimensional material; an etch stop layer arranged over the first interconnect dielectric layer and the second capping layer; a second interconnect dielectric layer arranged over the etch stop layer; and a second interconnect conductive structure extending through the second interconnect dielectric layer and the etch stop layer to contact the first interconnect conductive structure.

In other embodiments, the present disclosure relates to an integrated chip comprising: a first interconnect dielectric layer arranged over a substrate; a first interconnect conductive structure extending through the first interconnect dielectric layer; a second interconnect conductive structure extending through the first interconnect dielectric layer and laterally beside the first interconnect conductive structure; a first capping layer arranged over the first interconnect conductive structure and comprising a first two-dimensional material; a second capping layer arranged over the second interconnect conductive structure and comprising the first two-dimensional material; a third capping layer arranged over the first capping layer and comprising a second two-dimensional material different than the first two-dimensional material; an etch stop layer arranged over the third capping layer and the first interconnect dielectric layer; and a third interconnect conductive structure extending through the third capping layer to electrically contact the first interconnect conductive structure.

In yet other embodiments, the present disclosure relates to a method comprising: forming a first interconnect dielectric layer over a substrate; forming a first interconnect conductive structure within and extending through the first interconnect dielectric layer; forming a first capping layer selectively over the first interconnect conductive structure; forming a second capping layer over the first capping layer; forming an etch stop layer over the second capping layer and the first interconnect dielectric layer; forming a second interconnect dielectric layer over the etch stop layer; and forming a second interconnect conductive structure within and extending through the second interconnect dielectric layer and the etch stop layer to contact the first interconnect conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated chip comprising:
  a first interconnect dielectric layer arranged over a substrate;
  a first interconnect conductive structure extending through the first interconnect dielectric layer;
  a first capping layer arranged over the first interconnect conductive structure;
  a second capping layer arranged over the first capping layer, wherein the second capping layer comprises a material different than the first capping layer;
  an etch stop layer arranged over the first interconnect dielectric layer and the second capping layer;
  a second interconnect dielectric layer arranged over the etch stop layer;
  a second interconnect conductive structure extending through the second interconnect dielectric layer and the etch stop layer to contact the first interconnect conductive structure; and
  a third conductive interconnect structure disposed within the first interconnect dielectric layer and being laterally separated from the first conductive interconnect structure by the first interconnect dielectric layer, wherein the second capping layer continuously extends from directly over the first conductive interconnect structure to directly over the third conductive interconnect structure.

2. The integrated chip of claim 1, wherein a bottommost surface of the first capping layer is arranged directly over the first interconnect conductive structure and vertically below a topmost surface of the first interconnect dielectric layer.

3. The integrated chip of claim 1, wherein the first capping layer comprises a first two-dimensional material and the second capping layer comprises a second two-dimensional material.

4. The integrated chip of claim 1, wherein the second interconnect conductive structure extends through the first and second capping layers to directly contact the first interconnect conductive structure.

5. The integrated chip of claim 1, wherein the second interconnect conductive structure extends completely through the first and second capping layers.

6. The integrated chip of claim 1, wherein the second interconnect conductive structure extends through the second capping layer and has a bottommost surface that directly contacts the first capping layer.

7. The integrated chip of claim 1, further comprising:
a protection layer arranged laterally beside the first capping layer and directly on the first interconnect dielectric layer.

8. The integrated chip of claim 7, wherein the second capping layer is wider than the first capping layer and directly contacts the protection layer and the first capping layer.

9. An integrated chip comprising:
a first interconnect dielectric layer arranged over a substrate;
a first interconnect conductive structure extending through the first interconnect dielectric layer;
a second interconnect conductive structure extending through the first interconnect dielectric layer and laterally beside the first interconnect conductive structure;
a first capping layer arranged over the first interconnect conductive structure and comprising a first two-dimensional material;
a second capping layer arranged over the second interconnect conductive structure and comprising the first two-dimensional material;
a third capping layer arranged over the first capping layer and comprising a second two-dimensional material different than the first two-dimensional material;
an etch stop layer arranged over the third capping layer and the first interconnect dielectric layer; and
a third interconnect conductive structure extending through the third capping layer to electrically contact the first interconnect conductive structure.

10. The integrated chip of claim 9, wherein the first two-dimensional material is conductive.

11. The integrated chip of claim 9, further comprising:
a fourth capping layer arranged over the second capping layer, wherein the fourth capping layer is spaced apart from the third capping layer by the etch stop layer.

12. The integrated chip of claim 9, wherein the third capping layer extends over the first interconnect dielectric layer and also is arranged over the second capping layer.

13. The integrated chip of claim 12, wherein the second two-dimensional material is non-conductive.

14. The integrated chip of claim 9, further comprising:
a protection layer arranged laterally beside the first capping layer, laterally beside the second capping layer, and directly on the first interconnect dielectric layer, wherein the first capping layer is spaced apart from the second capping layer by the protection layer.

15. The integrated chip of claim 14, wherein the protection layer comprises a different material than the first interconnect dielectric layer.

16. The integrated chip of claim 14, wherein the third capping layer extends over the protection layer, the first capping layer, and the second capping layer.

17. An integrated chip, comprising:
a first interconnect arranged within a first inter-level dielectric over a substrate;
a first capping layer arranged over the first interconnect;
a second capping layer arranged over the first capping layer, wherein the second capping layer comprises a non-conductive material that is a different material than the first capping layer;
a second interconnect arranged over the second capping layer and within a second inter-level dielectric that is over the first inter-level dielectric; and
wherein the first capping layer and the second capping layer comprise two-dimensional materials respectively having a planar, hexagonal structure.

18. The integrated chip of claim 17, wherein the first capping layer or the second capping layer comprise graphene.

19. The integrated chip of claim 18, further comprising:
a protective layer vertically between an etch stop layer and the first inter-level dielectric, wherein the protective layer is arranged along sidewalls of the first capping layer.

20. The integrated chip of claim 17, wherein the second capping layer and the second capping layer comprise graphene, hexagonal boron nitride, molybdenum sulfide, tantalum sulfide, hafnium sulfide, tungsten selenide, borocarbonates, germanane, or $Ni_3(HITP)_2$.

* * * * *